US010256329B2

(12) United States Patent
Takatani et al.

(10) Patent No.: US 10,256,329 B2
(45) Date of Patent: Apr. 9, 2019

(54) HETEROJUNCTION BIPOLAR TRANSISTOR

(71) Applicant: WIN SEMICONDUCTORS CORP., Tao Yuan (TW)

(72) Inventors: Shinichiro Takatani, Tao Yuan (TW); Jui-Pin Chiu, Tao Yuan (TW); Chia-Ta Chang, Tao Yuan (TW)

(73) Assignee: Win Semiconductors Corp., Taoyuan (TW)

( * ) Notice: Subject to any disclaimer, the term of this patent is extended or adjusted under 35 U.S.C. 154(b) by 84 days.

(21) Appl. No.: 14/846,110

(22) Filed: Sep. 4, 2015

(65) Prior Publication Data

US 2017/0069739 A1 Mar. 9, 2017

(51) Int. Cl.
*H01L 29/00* (2006.01)
*H01L 29/737* (2006.01)
*H01L 29/205* (2006.01)
*H01L 29/10* (2006.01)
*H01L 29/08* (2006.01)
*H01L 29/207* (2006.01)

(52) U.S. Cl.
CPC ...... *H01L 29/7371* (2013.01); *H01L 29/0817* (2013.01); *H01L 29/1004* (2013.01); *H01L 29/205* (2013.01); *H01L 29/207* (2013.01)

(58) Field of Classification Search
CPC ............ H01L 29/7371; H01L 29/0817; H01L 29/1004; H01L 29/205
See application file for complete search history.

(56) References Cited

U.S. PATENT DOCUMENTS

| 5,548,138 A | * | 8/1996 | Tanimoto | H01L 29/802 |
| | | | | 257/192 |
| 7,482,643 B2 | * | 1/2009 | Sawada | H01L 29/0817 |
| | | | | 257/197 |
| 2010/0006143 A1 | * | 1/2010 | Welser | B82Y 20/00 |
| | | | | 136/255 |

FOREIGN PATENT DOCUMENTS

WO WO 2015-182593 * 12/2015

* cited by examiner

*Primary Examiner* — Dale E Page
*Assistant Examiner* — Quovaunda V Jefferson
(74) *Attorney, Agent, or Firm* — Muncy, Geissler, Olds & Lowe, P.C.

(57) ABSTRACT

A HBT on a GaAs substrate is presented, wherein its base comprises a first base layer comprising $In_iGa_{1-i}As$ with an Indium content i with a slope s1 and a second base layer on the emitter side comprising $In_jGa_{1-j}As$ with an Indium content j with a slope s2, and an average of s1 is half of the average of s2 or smaller; or the base comprises a first base layer comprising $In_mGa_{1-m}As$ with an Indium content m and a second base layer on the emitter side comprising $In_nGa_{1-n}As$ with an Indium content n, and an average of n is larger than the m at a second base layer side; or the base comprises a first base layer pseudomorphic to GaAs with a bulk lattice constant larger than GaAs, and the emitter comprises a first emitter layer pseudomorphic to GaAs with a bulk lattice constant smaller than GaAs.

16 Claims, 32 Drawing Sheets

| type | layer | In content | dopant | thickness (nm) | doping concentration (cm$^{-3}$) |
|---|---|---|---|---|---|
| emitter | n-InGaAs | 0 → 0.5 | Si | | |
| emitter | n-GaAs | - | Si | | |
| emitter | n-InGaP | 0.48 | Si | 40 | 3E17 |
| second base layer | p-InGaAs | 0.07 → 0 | C | 20 | 4E19 |
| first base layer | p-InGaAs | 0.07 | C | 50 | 4E19 |
| collector | n-InGaAs | 0 → 0.07 | Si | 5 | 1E15 |
| collector | n-GaAs | - | Si | | |
| sub collector | n-GaAs | - | Si | | |
| substrate | GaAs | - | | | |

Fig. 4A

| Type of device | first base layer $In_mGa_{1-m}As$ | | second base layer $In_nGa_{1-n}As$ | | second emitter layer $In_vGa_{1-v}P$ | | first emitter layer InGaP | | Vceoff (mV) |
|---|---|---|---|---|---|---|---|---|---|
| | T (nm) | In content m | T (nm) | In content n | T (nm) | In content v | T (nm) | In content | |
| Conventional GaAs base GaAs HBT | 44 | 0 | 0 | - | 0 | - | 40 | 0.48 | 197 |
| Conventional InGaAs base GaAs HBT 1 | 44 | 0.1 | 0 | - | 0 | - | 40 | 0.48 | 223 |
| Conventional InGaAs base GaAs HBT 2 | 44 | 0.12 | 0 | - | 0 | - | 40 | 0.48 | 228 |
| Conventional InGaAs base GaAs HBT 3 | 44 | 0.1 | 0 | - | 5 | 0.65 → 0.48 | 35 | 0.48 | 190 |
| Conventional InGaAs base GaAs HBT 4 | 44 | 0.12 | 0 | - | 5 | 0.65 → 0.48 | 35 | 0.48 | 196 |
| Embodiment 1 | 34 | 0.1 | 10 | 0.1 → 0.12 | 0 | - | 40 | 0.48 | 214 |
| Embodiment 2 | 34 | 0.1 | 10 | 0.1 → 0.12 | 5 | 0.65 → 0.48 | 35 | 0.48 | 181 |

Fig. 6D

| type | layer | In content | dopant | thickness (nm) | doping concentration (cm$^{-3}$) |
|---|---|---|---|---|---|
| emitter | n-InGaAs | 0 → 0.5 | Si | | |
| emitter | n-GaAs | - | Si | | |
| first emitter layer | n-InGaP | 0.48 | Si | 35 | 3E17 |
| second emitter layer | n-In$_v$Ga$_{1-v}$P | 0.65 → 0.48 | Si | 5 | 3E17 |
| second base layer | p-In$_n$Ga$_{1-n}$As | 0.1 → 0.12 | C | 10 | 4E19 |
| first base layer | p-In$_m$Ga$_{1-m}$As | 0.1 | C | 34 | 4E19 |
| collector | n-InGaAs | 0 → 0.1 | Si | 20 | 1E16 |
| collector | n-GaAs | - | Si | | |
| sub collector | n-GaAs | - | Si | | |
| substrate | GaAs | - | | | |

Fig. 7A

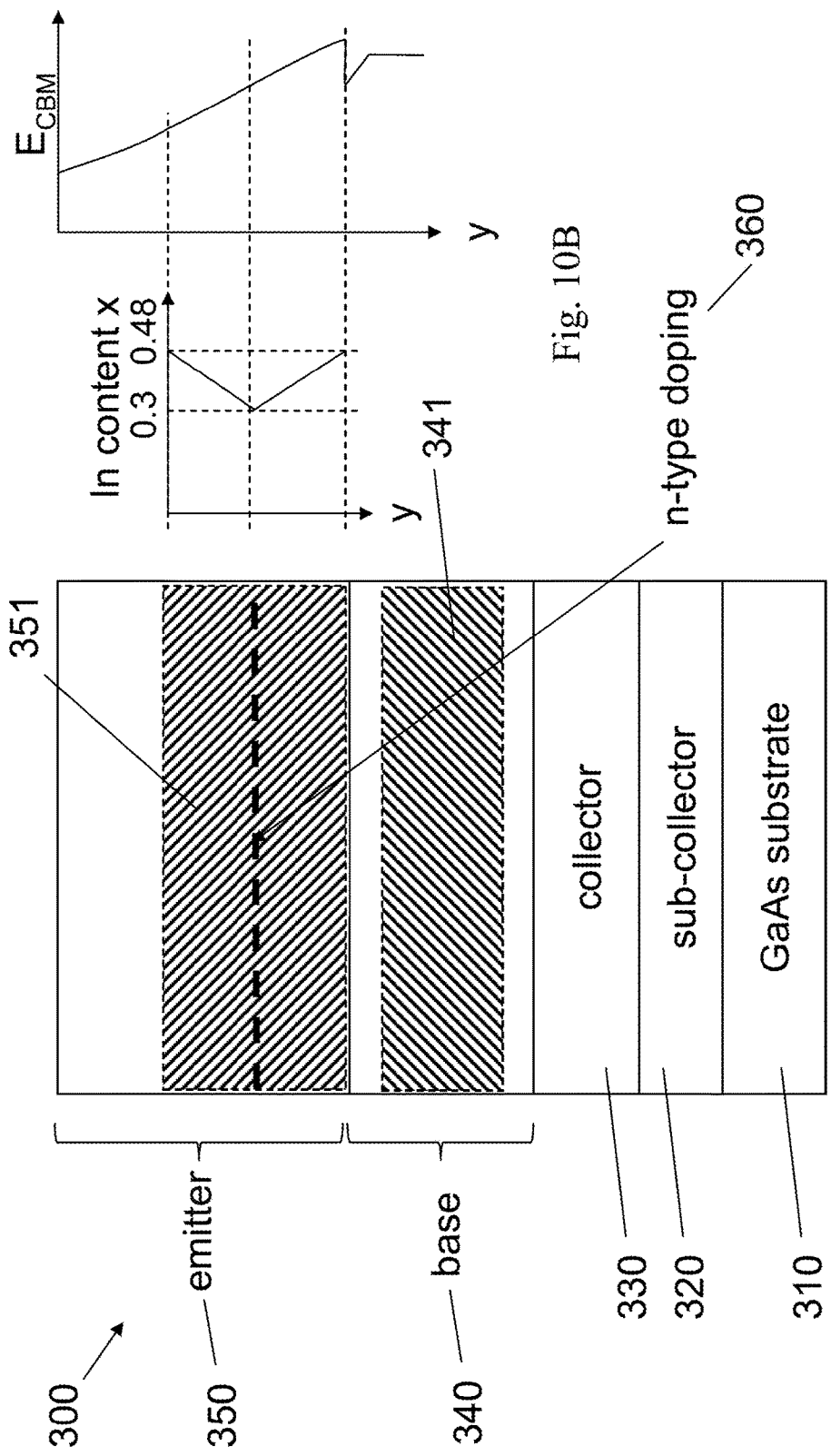

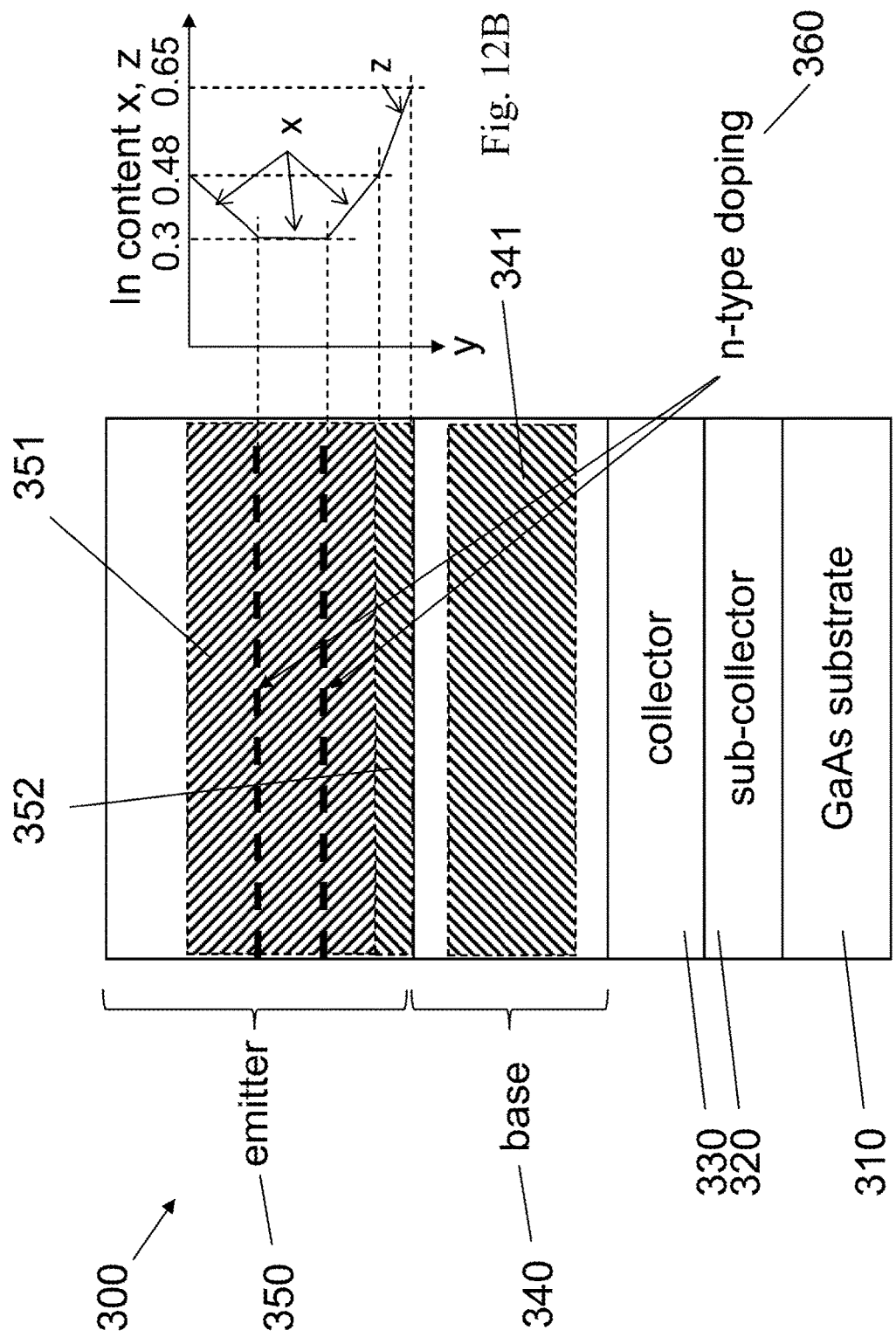

| type | layer | In content | dopant | thickness (nm) | doping concentration (cm⁻³) |
|---|---|---|---|---|---|
| emitter | n-InGaAs | 0 → 0.5 | Si | | |
| emitter | n-GaAs | - | Si | | |
| emitter | n-InGaP | 0.48 | Si | 35 | 3E17 |
| emitter | n-InGaP | 0.65 → 0.48 | Si | 5 | 3E17 |
| base | p-InGaAs | 0.1 | C | 63.5 | 4E19 |
| collector | n-InGaAs | 0 → 0.1 | Si | 20 | 1E16 |
| collector | n-GaAs | - | Si | | |
| sub collector | n-GaAs | - | Si | | |
| substrate | GaAs | - | | | |

Fig. 13A (Prior Art)

| type | layer | In content | dopant | thickness (nm) | doping concentration (cm$^{-3}$) |
|---|---|---|---|---|---|
| emitter | n-InGaAs | 0 → 0.5 | Si | | |
| emitter | n-GaAs | - | Si | | |
| first emitter layer | n-In$_x$Ga$_{1-x}$P | 0.3 → 0.48 | Si | 15 | 3E17 |
| | n-In$_x$Ga$_{1-x}$P | 0.48 → 0.3 | Si | 20 | 3E17 |
| second emitter layer | n-In$_z$Ga$_{1-z}$P | 0.65 → 0.48 | Si | 5 | 3E17 |
| first base layer | p-In$_o$Ga$_{1-o}$As | 0.1 | C | 63.5 | 4E19 |
| collector | n-InGaAs | 0 → 0.1 | Si | 20 | 1E16 |
| collector | n-GaAs | - | Si | | |
| sub collector | n-GaAs | - | Si | | |
| substrate | GaAs | - | | | |

Fig. 13B

| type | layer | In content | dopant | thickness (nm) | doping concentration (cm$^{-3}$) |
|---|---|---|---|---|---|
| emitter | n-InGaAs | 0 → 0.5 | Si | | |
| emitter | n-GaAs | - | Si | | |
| first emitter layer | n-In$_x$Ga$_{1-x}$P | 0.3 → 0.48 | Si | 10 | 3E17 |
| | n-In$_x$Ga$_{1-x}$P | 0.3 | Si | 20 | 3E17 |
| | n-In$_x$Ga$_{1-x}$P | 0.48 → 0.3 | Si | 5 | 3E17 |
| second emitter layer | n-In$_z$Ga$_{1-z}$P | 0.65 → 0.48 | Si | 5 | 3E17 |
| first base layer | p-In$_o$Ga$_{1-o}$As | 0.1 | C | 63.5 | 4E19 |
| collector | n-InGaAs | 0 → 0.1 | Si | 20 | 1E16 |
| collector | n-GaAs | - | Si | | |
| sub collector | n-GaAs | - | Si | | |
| substrate | GaAs | - | | | |

Fig. 13C

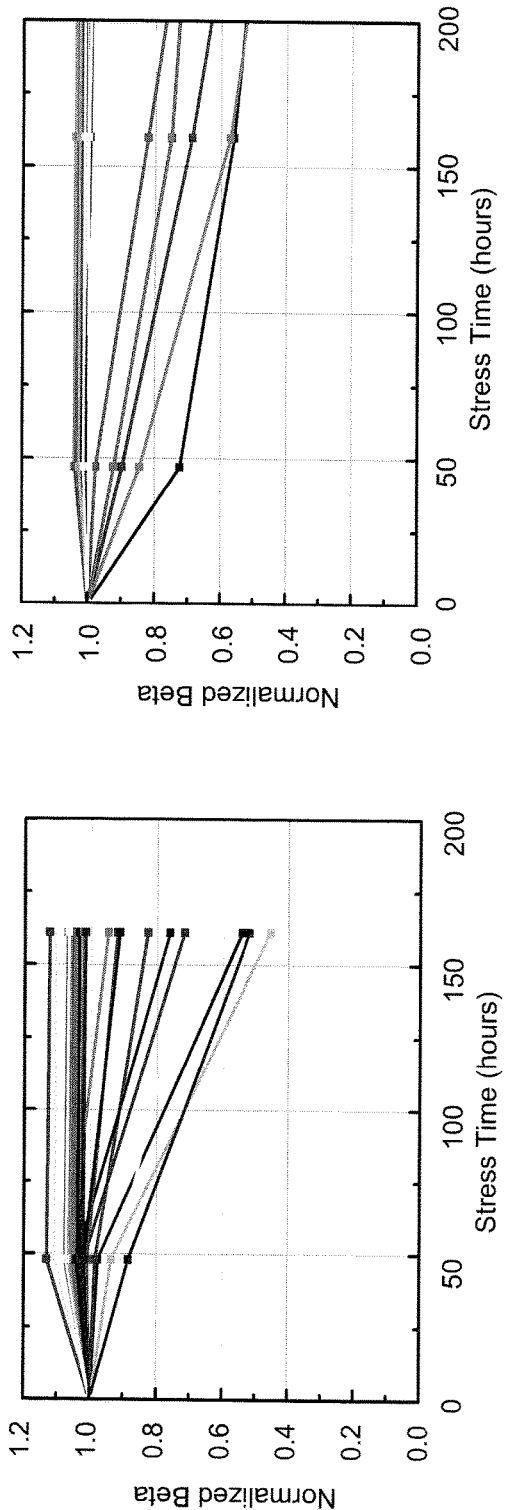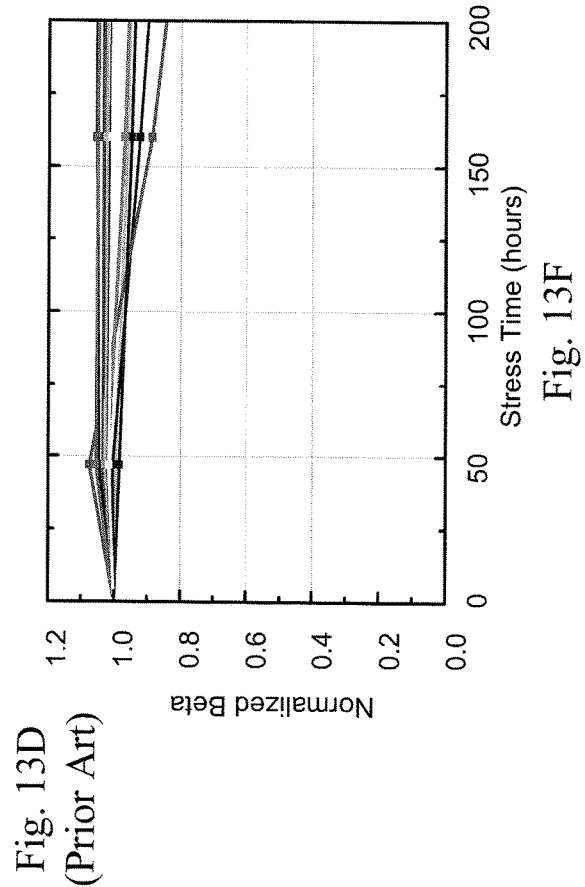
Fig. 13D (Prior Art)
Fig. 13E
Fig. 13F

| type | layer | In content | dopant | thickness (nm) | doping concentration (cm$^{-3}$) |
|---|---|---|---|---|---|
| emitter | n-InGaAs | 0 → 0.5 | Si | | |
| emitter | n-GaAs | - | Si | | |
| first emitter layer | n-In$_x$Ga$_{1-x}$P | 0.3 → 0.48 | Si | 5 | 3E17 |
| | n-In$_x$Ga$_{1-x}$P | 0.3 | Si | 0.2 | Planar dope |
| | n-In$_x$Ga$_{1-x}$P | 0.3 | Si | 20 | 3E17 |
| | n-In$_x$Ga$_{1-x}$P | 0.3 | Si | 0.2 | Planar dope |
| | n-In$_x$Ga$_{1-x}$P | 0.48 → 0.3 | Si | 10 | 3E17 |
| second emitter layer | n-In$_z$Ga$_{1-z}$P | 0.65 → 0.48 | Si | 5 | 3E17 |
| second base layer | p-In$_q$Ga$_{1-q}$As | 0.1 → 0.12 | C | 10 | 4E19 |
| first base layer | p-In$_o$Ga$_{1-o}$As | 0.1 | C | 44 | 4E19 |
| collector | n-InGaAs | 0 → 0.1 | Si | 20 | 1E16 |
| collector | n-GaAs | - | Si | | |
| sub collector | n-GaAs | - | Si | | |
| substrate | GaAs | - | | | |

Fig. 14A

| type | layer | In content | dopant | thickness (nm) | doping concentration (cm$^{-3}$) |
|---|---|---|---|---|---|
| emitter | n-InGaAs | 0 → 0.5 | Si | | |
| emitter | n-GaAs | - | Si | | |
| emitter | n-InGaP | 0.48 | Si | 40 | 3E17 |
| base | p-InGaAs | 0.1 | C | 54 | 4E19 |
| collector | n-InGaAs | 0 → 0.1 | Si | 20 | 1E16 |
| collector | n-GaAs | - | Si | | |
| sub collector | n-GaAs | - | Si | | |
| substrate | GaAs | | | | |

Fig. 14B (Prior Art)

HETEROJUNCTION BIPOLAR TRANSISTOR

FIELD OF THE INVENTION

The present invention relates to a heterojunction bipolar transistor, in particular, to a pseudomorphic heterojunction bipolar transistor which is formed on a GaAs substrate and made of compound semiconductor layers epitaxially grown thereon.

BACKGROUND OF THE INVENTION

The heterojunction bipolar transistor (abbreviated as HBT hereinafter) is a type of bipolar junction transistor (BJT) that uses different semiconductor materials for forming a heterojunction between emitter and base therein. The advantage of HBT is the high current gain and the low base resistance. In addition, the HBT made of compound semiconductor layers epitaxially grown on a GaAs substrate (abbreviated GaAs HBT hereinafter) has the high electron mobility due to the material properties of those layers, and is of great advantage to high-frequency applications. For example, the GaAs HBT is commonly used in cellular phone handsets, WiFi terminals, and their base stations as RF power amplifiers and other monolithic microwave integrated circuits (MMICs). The performance of the GaAs HBT is significantly improved by band gap engineering of the base, the emitter, and/or the collector using strained (pseudomorphic) semiconductor layers or semiconductor layers with graded composition. The conduction electron transit time of the HBT is thereby reduced leading to the improvement of high-frequency performance such as the higher current gain cutoff frequency (fT hereinafter) and the maximum oscillation frequency (fmax hereinafter).

A double HBT (abbreviated as DHBT hereinafter) is another type of HBT in which the band gap of both emitter and collector is wider than that of the base. It is known that an InGaP/GaAs/AlGaAs DHBT formed on a GaAs substrate can reduce the base-to-collector capacitance $C_{bc}$ in the bias region of low voltage drop across collector and emitter ($V_{ce}$) and high collector current ($I_c$) (i.e. knee region). The reduction of $C_{bc}$ leads to the high linearity in a power amplifier, such as the low error vector magnitude (EVM) of a WiFi signal modulation (refer to 13$^{th}$ GAAS Symposium, Paris, 2005, pp. 205-208). It is explained that the $C_{bc}$ reduction is attributable to the hole blocking by the valence band offset at the base-collector junction. Since the bandgap of the collector is larger than that of the base, there is a valence band offset at the base-collector junction in DHBTs, which blocks the diffusion of holes into the collector, and hence reduces the diffusion capacitance. However, fT and fmax of the InGaP/GaAs/AlGaAs DHBT are 30 GHz and 57 GHz, respectively, which are smaller than those of a typical GaAs HBT, i.e., more than 40 GHz in fT and more than 100 GHz in fmax. The fT and fmax of the HBT are related to the mobility of electrons in the material used for forming the base and to the saturation electron velocity of the material used for forming the collector. In order to improve the operation speed of DHBT, indispensable is to use a material with higher electron mobility for forming the base and a material with higher saturation electron velocity for forming the collector.

SUMMARY OF THE INVENTION

As stated above, the InGaP/GaAs/AlGaAs DHBT can reduce the $C_{bc}$ in the knee region of I-V curves, which leads to the improvement of the linearity of the HBT. A GaAs HBT comprising a pseudomorphic base layer, such as InGaAs and GaAsSb, also forms a DHBT-like structure even while the collector material is GaAs because the band gap of those materials is smaller than that of GaAs. Since the electron saturation velocity is higher for GaAs than AlGaAs, it is possible to improve both the high-frequency performance and the linearity at the same time by using a pseudomorphic base layer and a GaAs collector layer. In particular, a GaAs HBT comprising a pseudomorphic InGaAs base layer can substantially improve the high-frequency performance due to the higher electron mobility of InGaAs. Accordingly, in order to obtain a high speed GaAs HBT with an improved linearity, the present invention proposes to form the base layer using a pseudomorphic layer. In the GaAs HBT using a pseudomorphic base layer (pseudomorphic GaAs HBT hereafter), InGaAs, for example, the Indium content and the base layer thickness must be self-consistently optimized, so that the base layer is thinner than the critical thickness for a given Indium content. With increasing Indium content, the bulk lattice constant of InGaAs increases. Here, the term "bulk lattice constant" means the inherent lattice constant of the material when it is in a bulk form, i.e. not strained. The critical thickness for the pseudomorphic growth of InGaAs on a GaAs substrate is determined by the difference in the bulk lattice constant between the two materials, which is also called lattice-mismatch and is a function of the Indium content of the InGaAs. The base layer must be thinner than the critical thickness 1) in order to avoid forming misfit dislocations during the growth of the semiconductor layers due to the lattice mismatch between the base layer and the GaAs substrate as much as possible; 2) to prevent the multiplication of the misfit dislocations during device operation in a long term.

Despite the potential advantage of the high-frequency operation and the high linearity, it is difficult to reduce Vce offset (abbreviated as Vceoff hereinafter) as long as the InGaAs is used as the base material. The Vceoff is the offset voltage to turn-on in the Ic-Vce characteristics, i.e. Vce at which Ic is zero, as illustrated in FIG. 15. The smaller Vceoff is desirable when the device is used as a power amplifier. As shown in FIG. 15, the wider area in the current-voltage plane can be used for the load line in an amplifier operation when Vceoff is smaller. The linearity, the maximum output power, and the power-added efficiency can then be improved. It is commonly supposed that DHBTs leads to a smaller Vceoff, compared with a normal HBT. However, the inventors have found that Vceoff is actually increased by using InGaAs as the base material for the GaAs HBT using InGaP as the emitter material. FIG. 6D shows the two-dimensional simulation result of the Vceoff. In the conventional GaAs HBT comprising lattice-matched InGaP as the emitter and GaAs as the base, Vceoff is 197 mV. However, if the InGaAs base is used, Vceoff is increased to 223 mV and 228 mV for 10% and 12% Indium content, respectively. This is because InGaAs imposed into the base layer changes the balance point between the forward junction electron currents at emitter-base and collector-base junctions. FIG. 16 illustrates the conduction band edge ($E_{CBM}$) profile for GaAs HBTs using a GaAs base (solid line) and an InGaAs base (dashed line). The thick arrows illustrate the forward junction electron current across the emitter-base and collector-base junctions. The forward junction electron current is determined by the energy barrier for the conduction electrons. At the emitter-base junction, the energy barrier is determined by the conduction band edge of the InGaP emitter, which is the same for the GaAs base and the InGaAs base. However, at the collector-base junction, the conduction band edge is smoothly connected by a compositionally graded InGaAs layer for the InGaAs base. As a result, the energy barrier for the forward junction electron current is lowered and the imbalance in the forward junction electron current is increased for the InGaAs base. Thus, Vceoff is enlarged.

The first object of the present invention is to provide a GaAs HBT which comprises a pseudomorphic base layer having a composition gradient that is designed to reduce or eliminate the misfit dislocations, to reduce the base-collector capacitance $C_{bc}$, and to increase the DC current gain at the same moment; thereby significantly improving the DC and RF performance of the HBT.

The second object of the present invention is to provide a GaAs HBT which comprises a pseudomorphic base layer having a composition profile designed to reduce the offset voltage Vceoff.

The third object of the present invention is to provide a GaAs HBT which comprises a base layer pseudomorphic to GaAs with the bulk lattice constant larger than the bulk lattice constant of GaAs, and an emitter layer pseudomorphic to GaAs with the bulk lattice constant smaller than the bulk lattice constant of GaAs. The mechanical instability of the HBT structure can be then reduced. The formation and the multiplication of the misfit dislocations during the long-term device operation can be thus prevented.

To reach the first object stated above, the present invention provides an HBT comprising plural semiconductor layers epitaxially grown on a GaAs substrate, and forming a collector over the GaAs substrate, a base on the collector, and an emitter on the base, wherein the base further comprises a first base layer comprising $In_iGa_{1-i}As$ with an Indium content i being in the range 0<i<1, the Indium content i is uniformly distributed or varies from an emitter side to a collector side with a first slope s1 being defined as positive when the Indium content i increases from the emitter side to the collector side, and a second base layer inserted between the first base layer and the emitter and comprising $In_jGa_{1-j}As$ with an Indium content j being in the range 0<j<1, the Indium content j varies from the emitter side to the collector side with a second slope s2 being defined as positive when the indium content j increases from the emitter side to the collector side, wherein an average of the Indium content i is larger than an average of the Indium content j, wherein an average of the second slope s2 is positive, and wherein an average of the first slope s1 is less positive with its value being one half of an average of the second slope s2 or smaller.

In an implementation, the Indium content i is a constant.

In an implementation, the Indium content i in the first base layer is between 0.03 and 0.2.

To reach the second object stated above, the present invention provides a heterojunction bipolar transistor, comprising plural semiconductor layers epitaxially grown on a GaAs substrate, and forming a collector over the GaAs substrate, a base on the collector, and an emitter on the base, wherein the base further comprises a first base layer consisting of $In_mGa_{1-m}As$ with an Indium content m being in the range 0<m<1, and a second base layer inserted between the first base layer and the emitter and consisting of $In_nGa_{1-n}As$ with an Indium content n being in the range 0<n<1, and an average of the Indium content n through the second base layer is larger than the Indium content m at a second base layer side inside the first base layer.

In an implementation, the Indium content n in the second base layer is increased from a first base layer side to an emitter side.

In an implementation, the Indium content m in the first base layer is between 0.03 and 0.2.

In an implementation, the emitter comprises a first emitter layer lattice-matched to GaAs, and the emitter further comprises a second emitter layer inserted between the second base layer and the first emitter layer, wherein the second emitter layer consists of $In_vGa_{1-v}P$ with an Indium content v being between 0.53 and 0.8.

To reach the third object stated above, the present invention provides a heterojunction bipolar transistor, comprising plural semiconductor layers epitaxially grown on a GaAs substrate, and forming a collector above the GaAs substrate, a base on the collector, and an emitter on the base, wherein the base comprises a first base layer which is pseudomorphic to GaAs with a first bulk lattice constant at least 0.15% larger than the bulk lattice constant of GaAs, and the emitter comprises a first emitter layer which is pseudomorphic to GaAs with a second bulk lattice constant at least 0.15% smaller than the bulk lattice constant of GaAs.

In an implementation, the first emitter layer consists of $In_xGa_{1-x}As_{1-y}P_y$ with an Indium content x and a Phosphorus content y being between 0 and 1 with the combination of x and y satisfying the condition that the bulk lattice constant of the first emitter layer is at least 0.15% smaller than the bulk lattice constant of GaAs.

In an implementation, the first emitter layer consists of $In_xGa_{1-x}P$ with an Indium content x between 0.1 and 0.44.

In an implementation, the first emitter layer consists of $In_xGa_{1-x}P$ with an Indium content x being between 0.1 and 0.44, and the emitter further comprising a second emitter layer inserted between the first base layer and the first emitter layer, wherein the second emitter layer consists of $In_zGa_{1-z}P$ with an Indium content z being between 0.53 and 0.8.

In an implementation, the first emitter layer consists of $GaAs_{1-y}P_y$ with a Phosphorus content y being between 0.03 and 0.5.

In an implementation, the first base layer consists of $In_oGa_{1-o}As_{1-p}Sb_p$ with an Indium content o and an Antimony content p being between 0 and 1 with the combination of o and p satisfying the condition that the bulk lattice constant of the first base layer is at least 0.15% larger than the bulk lattice constant of GaAs.

In an implementation, the first base layer consists of $In_oGa_{1-o}As$ with an Indium content o being between 0.03 and 0.2.

In an implementation, the first base layer consists of $In_oGa_{1-o}As$ with the Indium content o being between 0.03 and 0.2, and the base further comprises a second base layer inserted between the first base layer and the first emitter layer, and the second base layer consisting of $In_qGa_{1-q}As$ with an average Indium content q being larger than the Indium content o at a second base layer side inside the first base layer.

In an implementation, the Indium content q in the second base layer increases from a first base layer side to an emitter side.

In an implementation, the first base layer consists of $GaAs_{1-p}Sb_p$ with an Antimony content p being between 0.03 and 0.2.

The present invention will be understood better by reference to the detailed description of the drawings and the preferred embodiments below.

BRIEF DESCRIPTION OF DRAWINGS

FIG. 4A is a diagram showing a GaAs HBT according to an embodiment of the present invention.

FIG. 6D is a diagram showing Vceoff calculated by two-dimensional device simulation for five conventional GaAs HBTs and two embodiments of the present invention.

FIG. 7A is a diagram showing a GaAs HBT according to an embodiment of the present invention.

FIG. 10A is a cross-sectional view of a GaAs HBT according to an embodiment of the present invention. FIG. 10B is a diagram showing the distribution of Indium content inside the first emitter layer along the stacking direction of the semiconductor layers in an embodiment of the GaAs HBT shown in FIG. 10A and the resulting profile of the conduction band edge $E_{CBM}$.

FIG. 12A is a cross-sectional view of a GaAs HBT according to an embodiment of the present invention. FIG. 12B is a diagram showing the distribution of Indium content inside the first and second emitter layers along the stacking direction of the semiconductor layers in an embodiment of the GaAs HBT shown in FIG. 12A.

FIG. 13A is a diagram showing a conventional InGaAs base GaAs HBT. FIGS. 13B and 13C are diagrams showing GaAs HBTs according to embodiments of the present invention. FIGS. 13D, 13E, and 13F are diagrams showing the results of the high-temperature operation lifetime (HTOL) test with the GaAs HBTs shown in FIGS. 13A, 13B, and 13C, respectively.

FIG. 14A is a diagram showing a GaAs HBT according to an embodiment of the present invention. FIG. 14B is a diagram showing a conventional InGaAs base pseudomorphic GaAs HBT.

DETAILED DESCRIPTIONS OF PREFERRED EMBODIMENTS

The embodiments according to the present invention will hereinafter be described with reference to the drawings.

Figure 1:
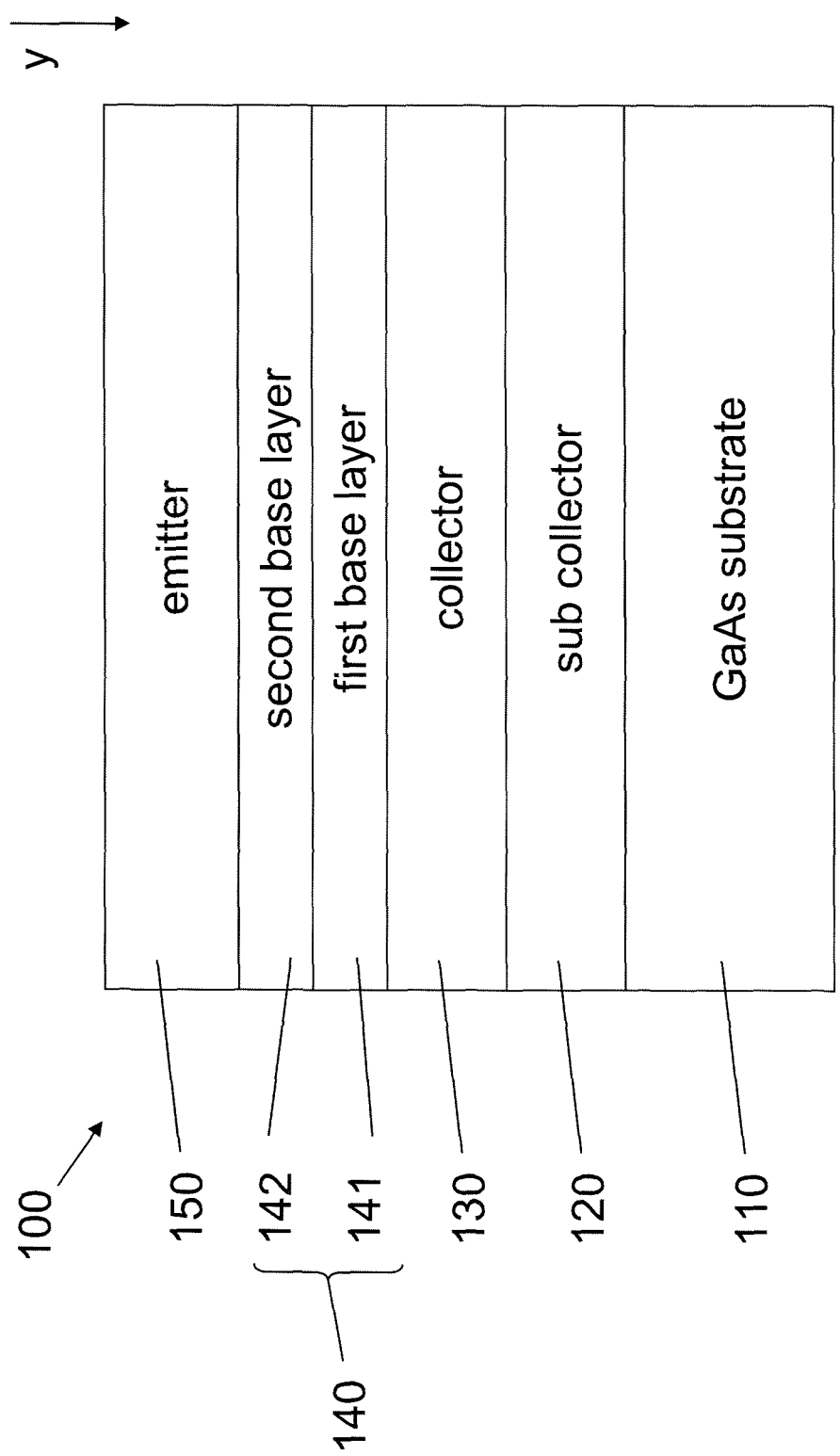
FIG. 1 is a cross-sectional view of a GaAs HBT according to an embodiment of the present invention.

FIG. 1 shows an embodiment of a GaAs heterojunction bipolar transistor (HBT) 100 provided by the present invention. The GaAs HBT 100 comprises a GaAs substrate 110 and plural semiconductor layers epitaxially grown on the GaAs substrate 110. The plural semiconductor layers sequentially form a sub-collector 120, a collector 130, a base 140, and an emitter 150, in which the base 140 comprises a first base layer 141 and a second base layer 142. The first base layer 141 is formed on the collector 130 and the second base layer 142 is formed between the first base layer 141 and the emitter 150.

The first base layer 141 comprises $In_iGa_{1-i}As$ with an Indium content i being in the range 0<i<1, and the second base layer 142 comprises $In_jGa_{1-j}As$ with an Indium content j being in the range 0<j<1. The Indium content i of the first base layer 141 is uniformly distributed or varies from the emitter side to the collector side with a first slope s1, and the Indium content j of the second base layer 142 varies from the emitter side to the collector side with a second slope s2. Here, the sign of the slope s1 and s2 is defined as positive when the Indium content increases from the emitter side to the collector side. The second base layer 142 is designed to have a positive slope s2 on average. On the other hand, the first base layer 141 is designed to have a much larger average Indium content and a much less positive composition gradient than the second base layer 142 in the present invention. In a preferable embodiment of the present invention, the average of the first slope s1 is half of the average of the second slope s2 or smaller. In an extreme case, the Indium content i is a constant. In another extreme case, the first slope s1 may be even slightly negative. In some embodiments, the Indium content i in the first base layer 141 is between 0.03 and 0.2. As shown in FIG. 1, the y-axis is directed from the emitter side to the collector side along the stacking direction of the plural semiconductor layers.

Figures 2A, 2B:
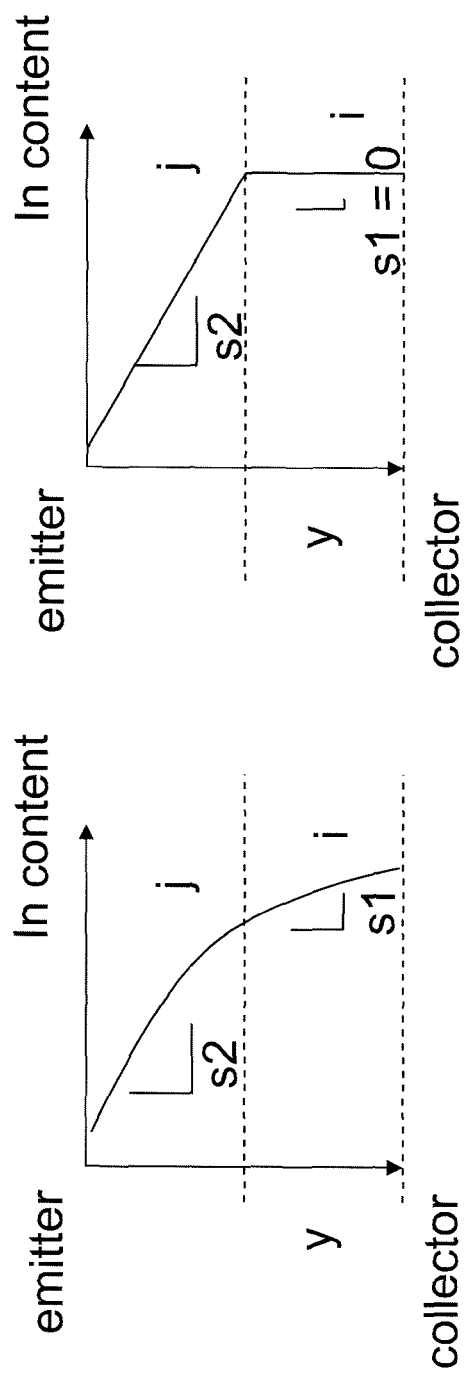
FIGS. 2A and 2B are diagrams showing the distribution of Indium content of the base layers along the stacking direction of the semiconductor layers in two embodiments of the GaAs HBT shown in FIG. 1.

FIGS. 2A and 2B show two embodiments of the distribution of Indium contents i and j along the y-axis. In the embodiment shown in FIG. 2A, the average of the second slope s is positive, and the average of the first slope s1 is smaller than half of the average of the second slope s2. FIG. 2B shows an extreme embodiment, in which the Indium content gradient only exists in the second base layer 142 and the Indium content in the first base layer 141 is uniform, indicating that the average of the first slope s1 is zero. The total amount of Indium in the base 140 provided by the present invention is reduced compared with the case that the whole base consists of a single InGaAs layer with the same average Indium content as that of the first base layer. As a result, the misfit dislocations are reduced or eliminated. Since the total base thickness is unchanged, the base sheet resistance is also unchanged. Moreover, the built-in drift electric field imposed by the second slope s2 in the second base layer 142 prevents the electron-hole recombination at the emitter/base junction and thus contributes to the increase of the current gain. On the other hand, the first base layer 141 with the large Indium content reduces the base-collector capacitance $C_{bc}$. It is because the diffusion capacitance is reduced, as is suggested with the InGaP/GaAs/AlGaAs DHBT, and/or the depletion capacitance is reduced owing to the reduced base onset voltage $V_{be}$. Thus, the RF performance is improved.

Figure 3A:
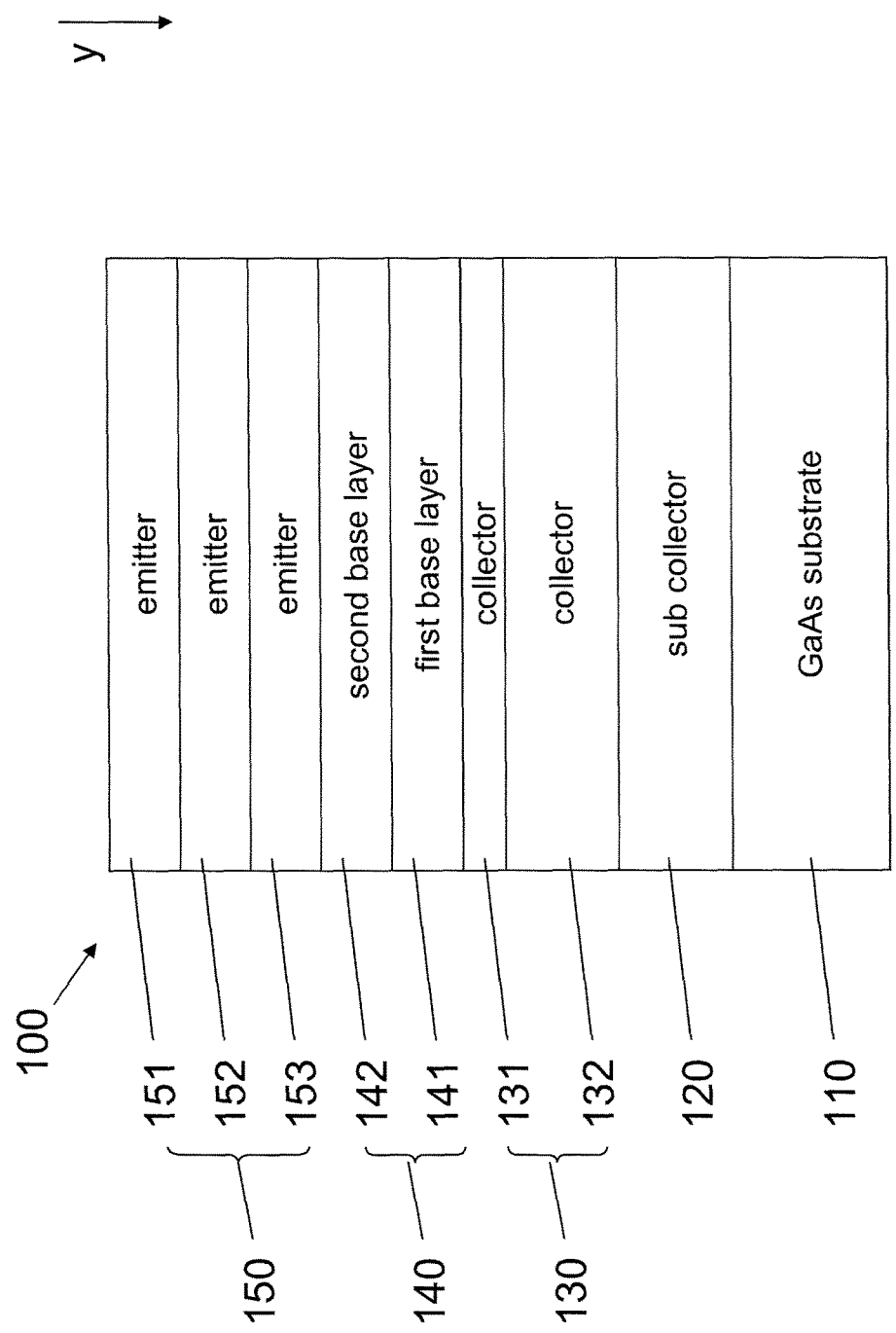
FIG. 3A is a cross-sectional view of a GaAs HBT according to an embodiment of the present invention.
Figures 3B, 3C:
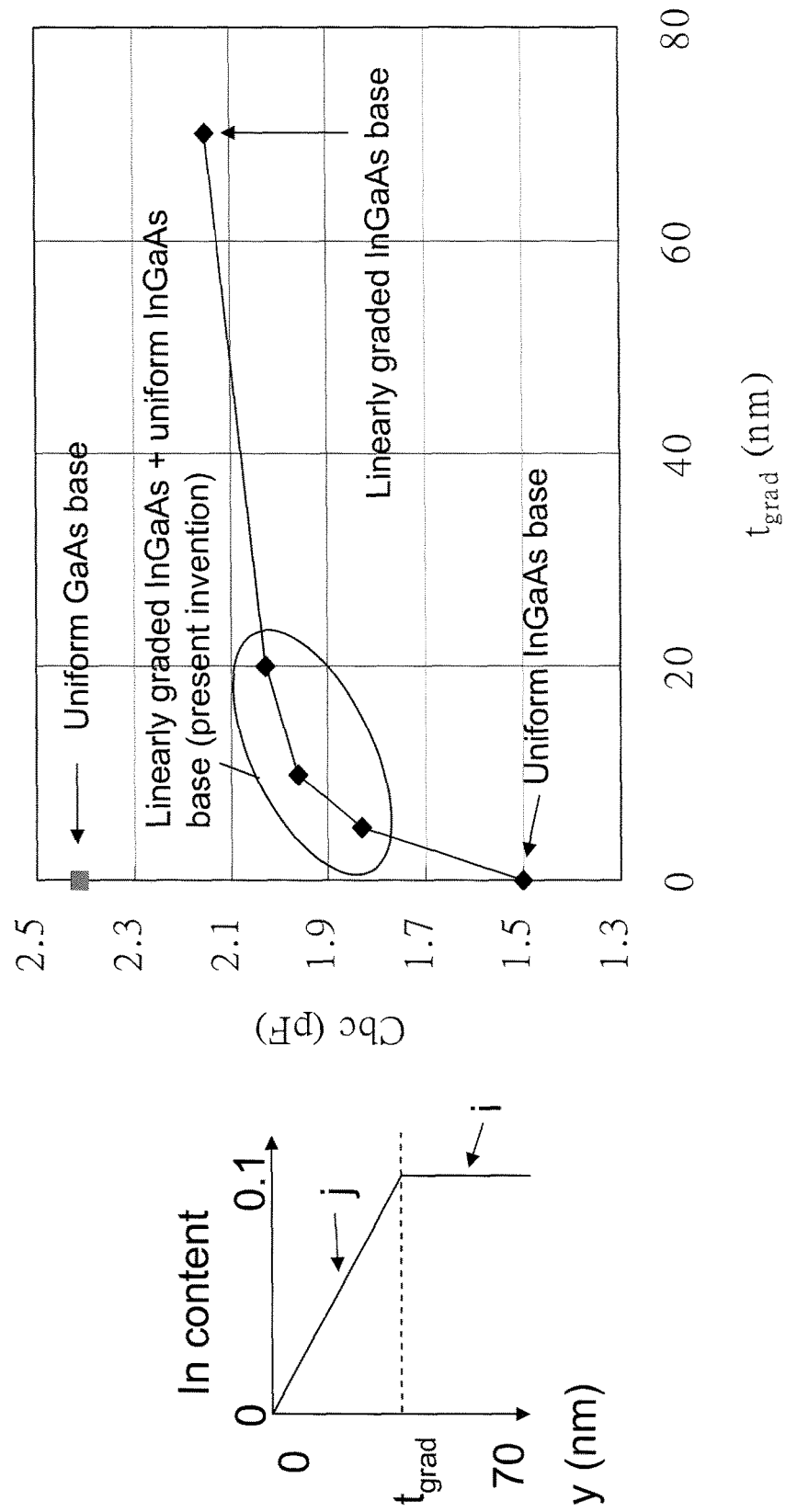
FIG. 3B is a diagram showing the distribution of Indium content of the base layers along the stacking direction of the semiconductor layers in an embodiment of the HBT shown in FIG. 3A.
FIG. 3C is a diagram showing the two-dimensional device simulation results of the $C_{bc}$ plotted as a function of the thickness of the second base layer $t_{grad}$ of the GaAs HBT shown in FIG. 3A.

FIG. 3A shows another embodiment of the GaAs HBT 100 provided by the present invention, in which the emitter 150 consists of an InGaAs contact layer 151, a GaAs layer 152, and a lattice-matched InGaP layer 153 with an Indium content being 0.48. Either 0.48 or 0.49 as regarded as the Indium content that gives the lattice constant matched to GaAs. In the present invention, 0.48 is regarded as the Indium content for the lattice-matched InGaP. The thickness and the doping concentration of the InGaP layer 151 are 40 nm and $2\times10^{17}$ cm$^{-3}$, respectively. The thickness of the second base layer 142 $t_{grad}$ is varied while the total base thickness is fixed at 70 nm. As shown in FIG. 3B, the Indium content is linearly graded from 0 to 0.1 in the second base layer 142, and is fixed at 0.1 in the first base layer 141. At the base-collector junction, there is a thin InGaAs collector layer 131 with the Indium content graded from 0.1 at the base side to 0 at the collector side. This layer is introduced to smoothly connect the conduction band edge between the base and the collector. The thickness of the InGaAs collector layer 131 is typically between 5 nm and 30 nm. The collector layer 132 is composed of GaAs with the thickness being 1 µm.

The base-collector capacitance $C_{bc}$ in the knee region (low collector voltage/high collector current region) with the GaAs HBT structure shown in FIG. 3A is simulated. FIG. 3C shows the results of a two-dimensional device simulation of the $C_{bc}$ plotted as a function of the $t_{grad}$ thickness of the second base layer 142 when the emitter size is 3 µm×40 µm×3 fingers, $V_{ce}$=0.5V, and $I_c$=100 mA. Comparing with the extreme case where the whole base layer is linearly graded (i.e. $t_{grad}$=70 nm), $C_{bc}$ is reduced if the thickness of the base layer with uniform composition (the first base layer) is increased. The $C_{bc}$ is reduced and the misfit dislocation can also be reduced or eliminated simultaneously while $t_{grad}$ is greater than 0 and smaller than 70 nm.

Figure 4B:
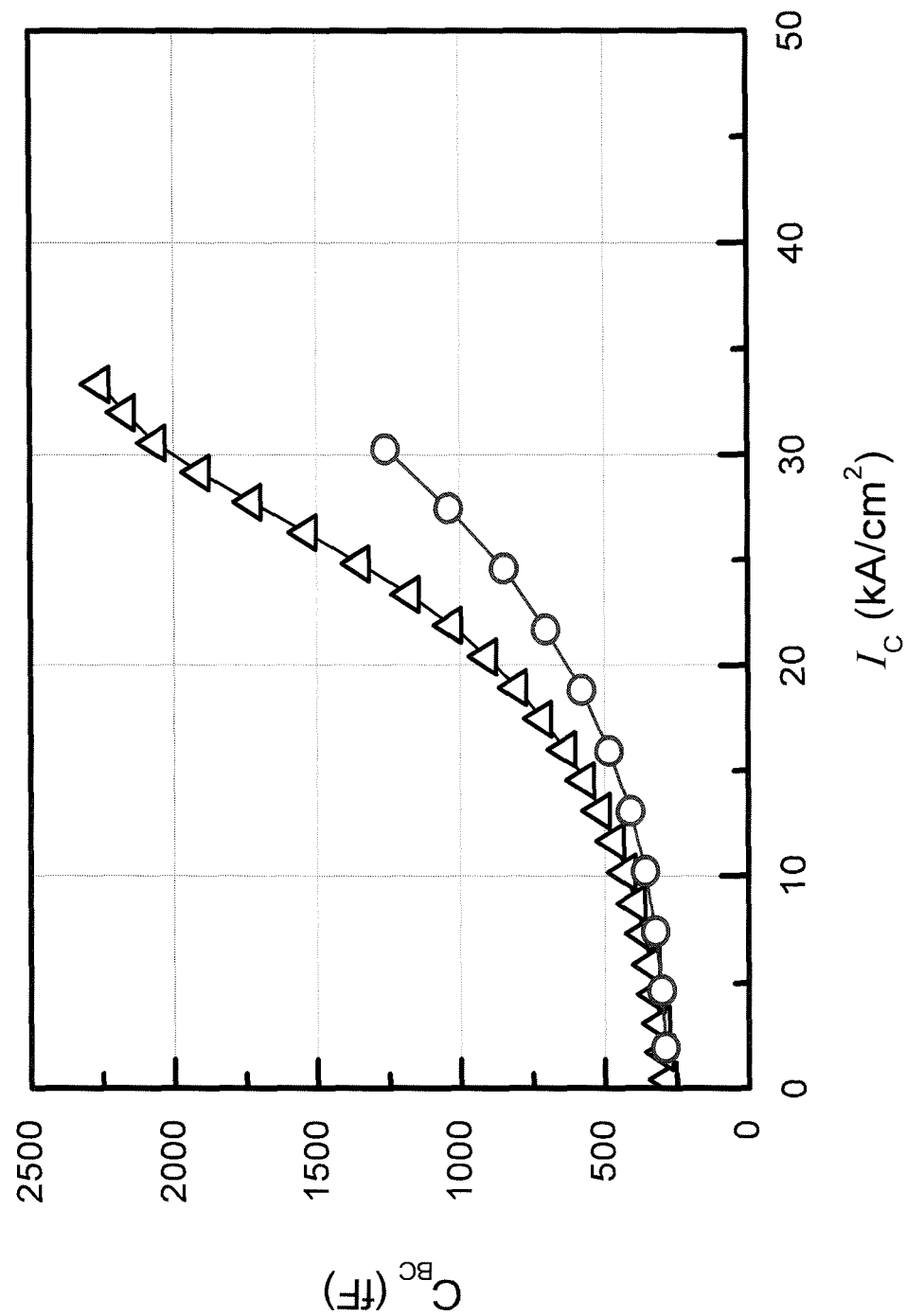
FIG. 4B is a diagram showing measured $C_{bc}$ plotted as a function of $I_c$ with the GaAs HBT structure shown in FIG. 4A (circle) and a GaAs HBT with a GaAs base (triangle).

FIG. 4A shows an embodiment of the GaAs HBT 100 shown in FIG. 3A, in which the semiconductor layers are fabricated using an epitaxial wafer grown on a GaAs substrate by metal-organic chemical vapor deposition. The Indium content of the second base layer 142 is linearly graded from 0.07 at the first base layer side to 0 at the emitter side. The Indium content in the first base layer 141 is fixed at 0.07. The collector layer 131 has the Indium content which is graded from 0 at the collector side to 0.07 at the first base layer side. In FIG. 4A and also in other tables showing the device structures, the arrow between two numbers, 0.07→0, for example, means that the content of the element is continuously graded from 0.07 at the bottom to 0 at the top of the layer. After optimizing the thickness of the first and the second base layers, a DC current gain equal to 140 is achieved when the first base layer and the second base layer are 50 nm and 20 nm, respectively. FIG. 4B shows a measured $C_{bc}$ plotted as a function of $I_c$ of the GaAs HBT shown in FIG. 4A (circle) and a conventional GaAs HBT in which GaAs is the base material (triangle) for the emitter size of 3 µm×40 µm×3 fingers and Vce=0.5 V. It is shown that the $C_{bc}$ is smaller for the GaAs HBT of the present invention than for the conventional one, particularly at a large $I_c$ corresponding to the knee region.

Figure 4C:
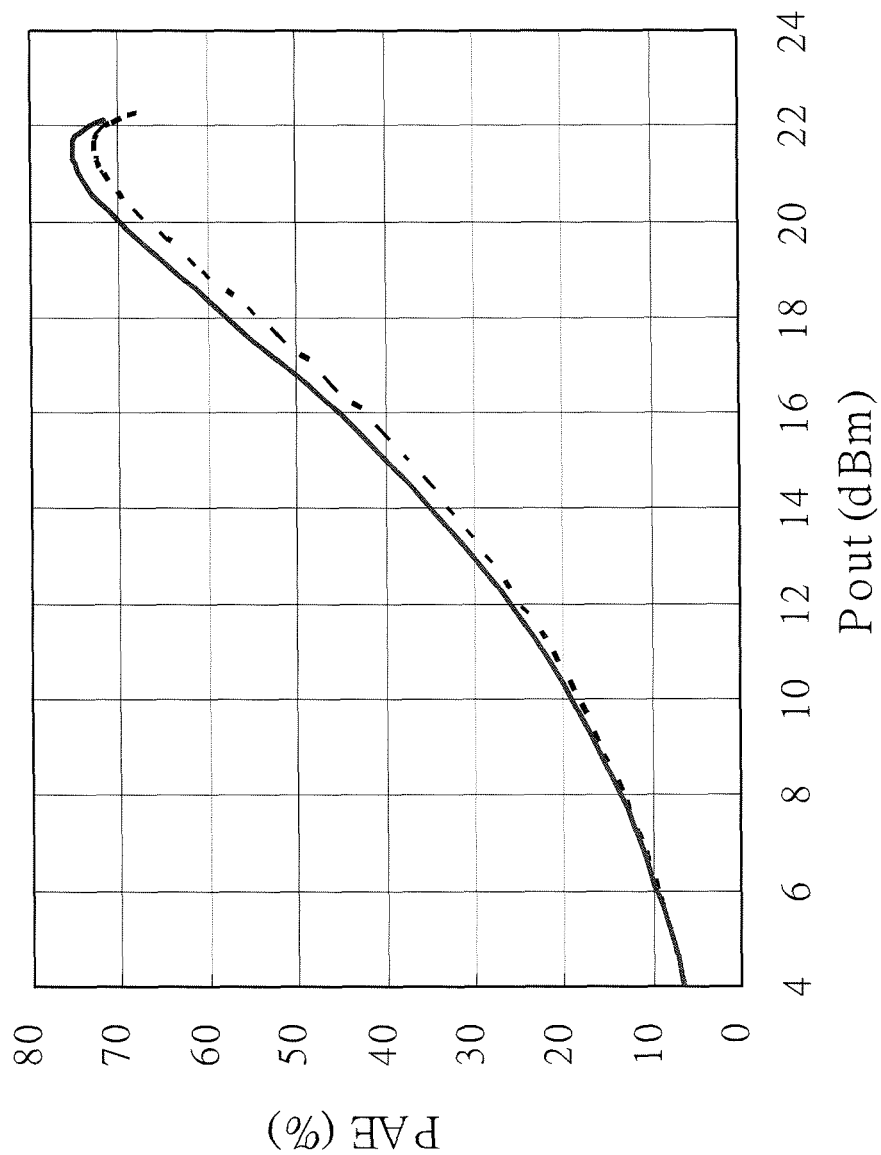
FIG. 4C is a diagram showing measured power-added efficiency (PAE) plotted as a function of output power (Pout) of the GaAs HBT shown in FIG. 4A (solid line) and the GaAs HBT with the GaAs base (dashed line).

The RF performance of the GaAs HBT shown in FIG. 4A is evaluated. A load-pull measurement of the device is done with the frequency being 0.9 GHz, the emitter size being 3 µm×40 µm×3 fingers, $V_c$ being 3.6V, and $I_c$ being 10 mA. FIG. 4C shows the power-added efficiency (PAE) plotted as a function of the output power (Pout) of the present invention (solid line) and of a GaAs HBT in which GaAs is the base material (dashed line). The maximum PAE in the high power region is improved for the GaAs HBT according to the present invention. This is due to the reduced $C_{bc}$ at the knee region, which reduces the gain suppression at the high power.

Figure 4D:
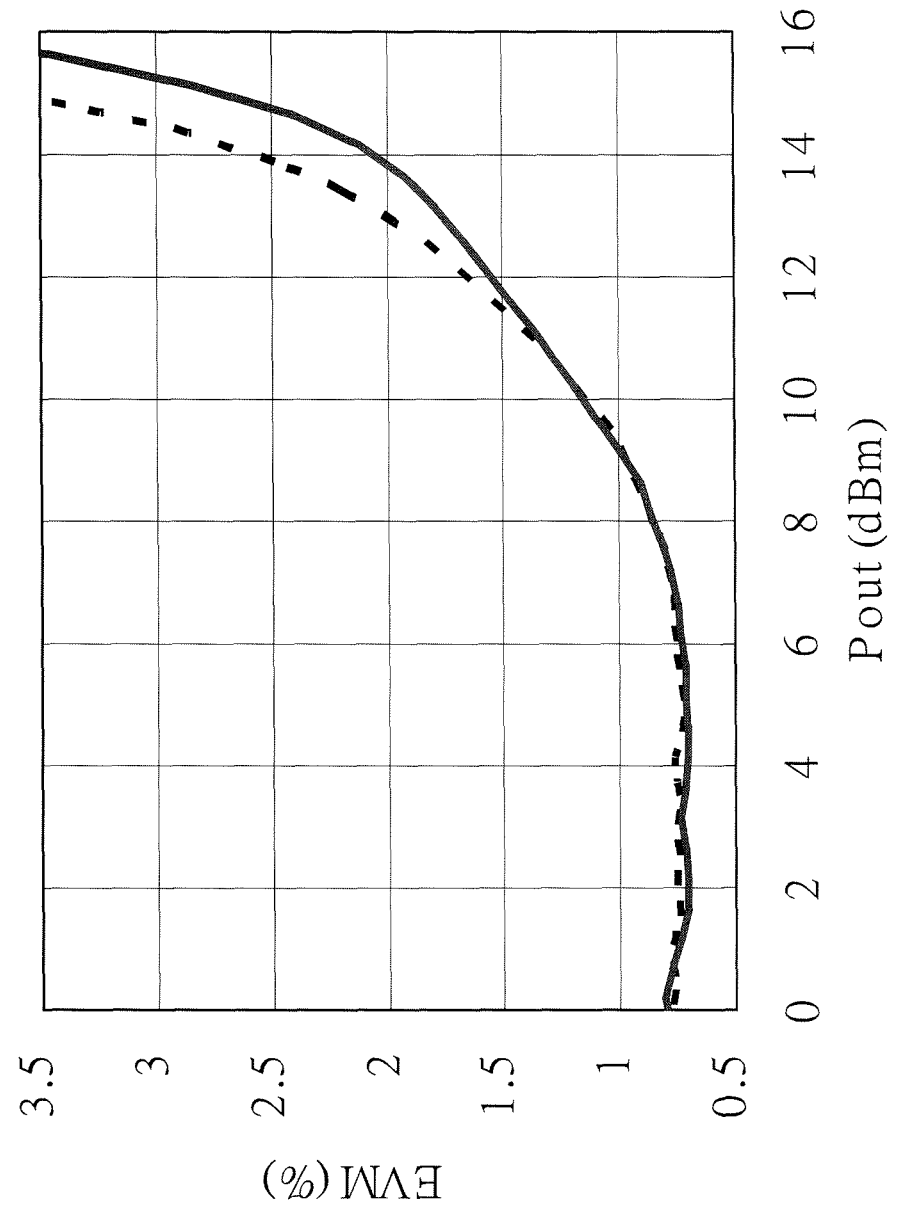
FIG. 4D is a diagram showing measured Error Vector Magnitude (EVM) for a WiFi IEEE 802.11 modulation for the GaAs HBT shown in FIG. 4A (solid line) and the GaAs HBT with the GaAs base (dashed line).

FIG. 4D shows the Error Vector Magnitude (EVM) of power amplifiers operating with a WiFi IEEE 802.11a modulation. The EVM is evaluated for the power amplifiers fabricated using the GaAs HBT shown in FIG. 4A (solid line) and a GaAs HBT in which GaAs is the base material (dashed line) with the frequency being 5.8 GHz, the emitter size being 3 µm×40 µm×3 fingers, $V_c$ being 5V, and $I_c$ being 23 mA. The output power (Pout) of the power amplifier fabricated using the GaAs HBT of the present invention at a given EVM is improved by about 0.8 dB with the EVM being between 1.8% and 3% which is required in the IEEE802.11 standards.

Figure 5A:
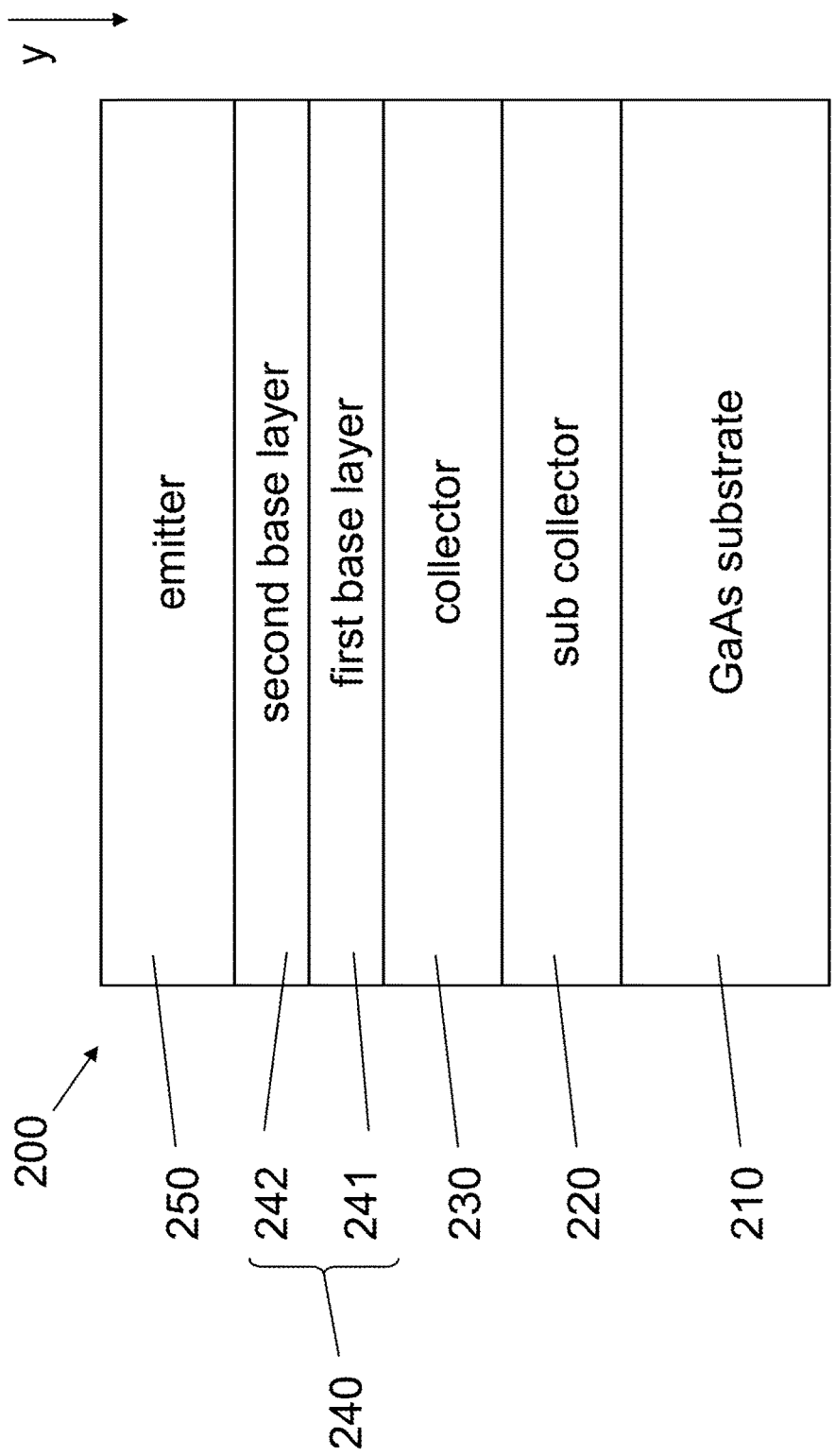
FIG. 5A is a cross-sectional view of a GaAs HBT according to an embodiment of the present invention.

FIG. 5A shows an embodiment of a GaAs HBT 200 provided by the present invention. The GaAs HBT 200 comprises a GaAs substrate 210 and plural semiconductor layers epitaxially grown on the GaAs substrate 210. The plural semiconductor layers sequentially form a sub-collector 220, a collector 230, a base 240, and an emitter 250, in which the base 240 further comprises a first base layer 241 and a second base layer 242. The first base layer 241 is formed on the collector 230 and the second base layer 242 is formed between the first base layer 241 and the emitter 250.

Figure 5D:
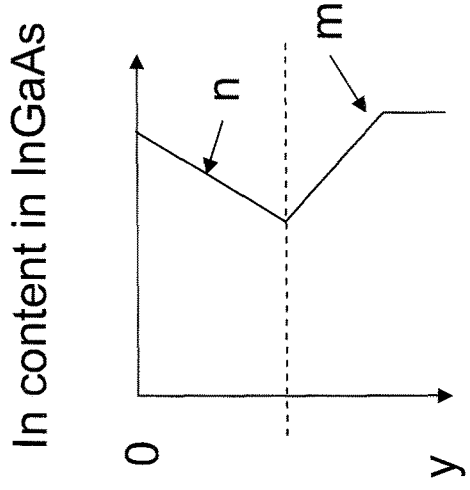
FIGS. 5B, 5C, and 5D are diagrams showing the distribution of Indium content of the base layers along the stacking direction of the semiconductor layers in three embodiments of the GaAs HBT shown in FIG. 5A.
Figure 5C:
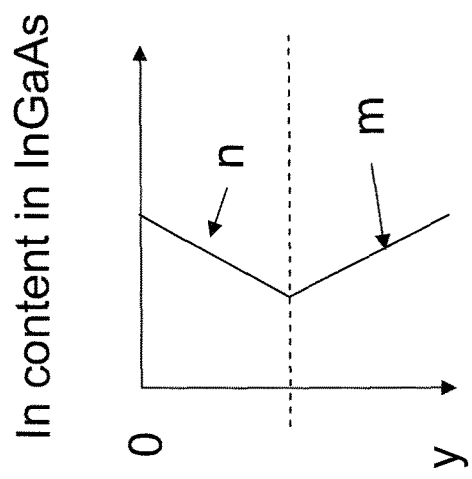
Figure 5B:
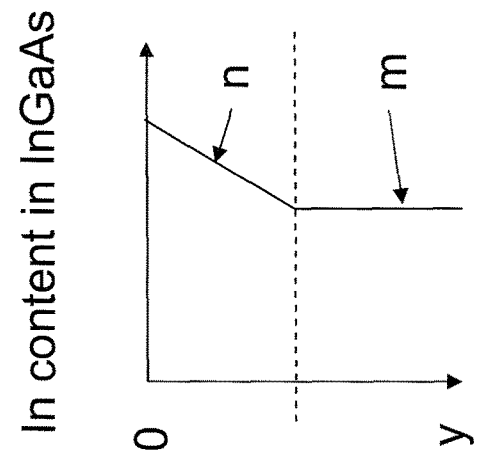

The first base layer 241 consists of $In_mGa_{1-m}As$ with an Indium content m being in the range 0<m<1, and the second base layer 242 consists of $In_nGa_{1-n}As$ with an Indium content n being in the range 0<n<1. The average Indium content n of second base layer 242 is larger than the Indium content m at the second base layer side inside first base layer 241. As shown in FIG. 5A, the y-axis is directed from the emitter side to the collector side along the stacking direction of the plural semiconductor layers. In some embodiments, the Indium content n of second base layer 242 continuously increases from the first base layer side to the emitter side as shown in FIGS. 5B, 5C, and 5D. On the other hand, the Indium content m of the first base layer may be uniform or may increase or decrease from the second base side to the collector side. Some preferred Indium content profiles are shown in FIGS. 5B, 5C, and 5D. In FIG. 5B, the Indium content m of the first base layer is uniform. In FIG. 5C, the Indium content m increases from the second base layer side to the collector side. In FIG. 5D, the Indium content m increases from the second base layer side, then becomes uniform near the collector side. The Indium content profile in the first base layer shown in FIG. 5D corresponds to the first and the second base layers in the other embodiment of the present invention (GaAs HBT 100), whose composition profile is shown in FIG. 2B. In the present invention, the Indium content of the InGaAs base is designed to make the base rich in Indium near the emitter-base junction compared with the inside the base. In some embodiments, the Indium content m of the first base layer 241 is between 0.03 and 0.2.

Figure 6A:
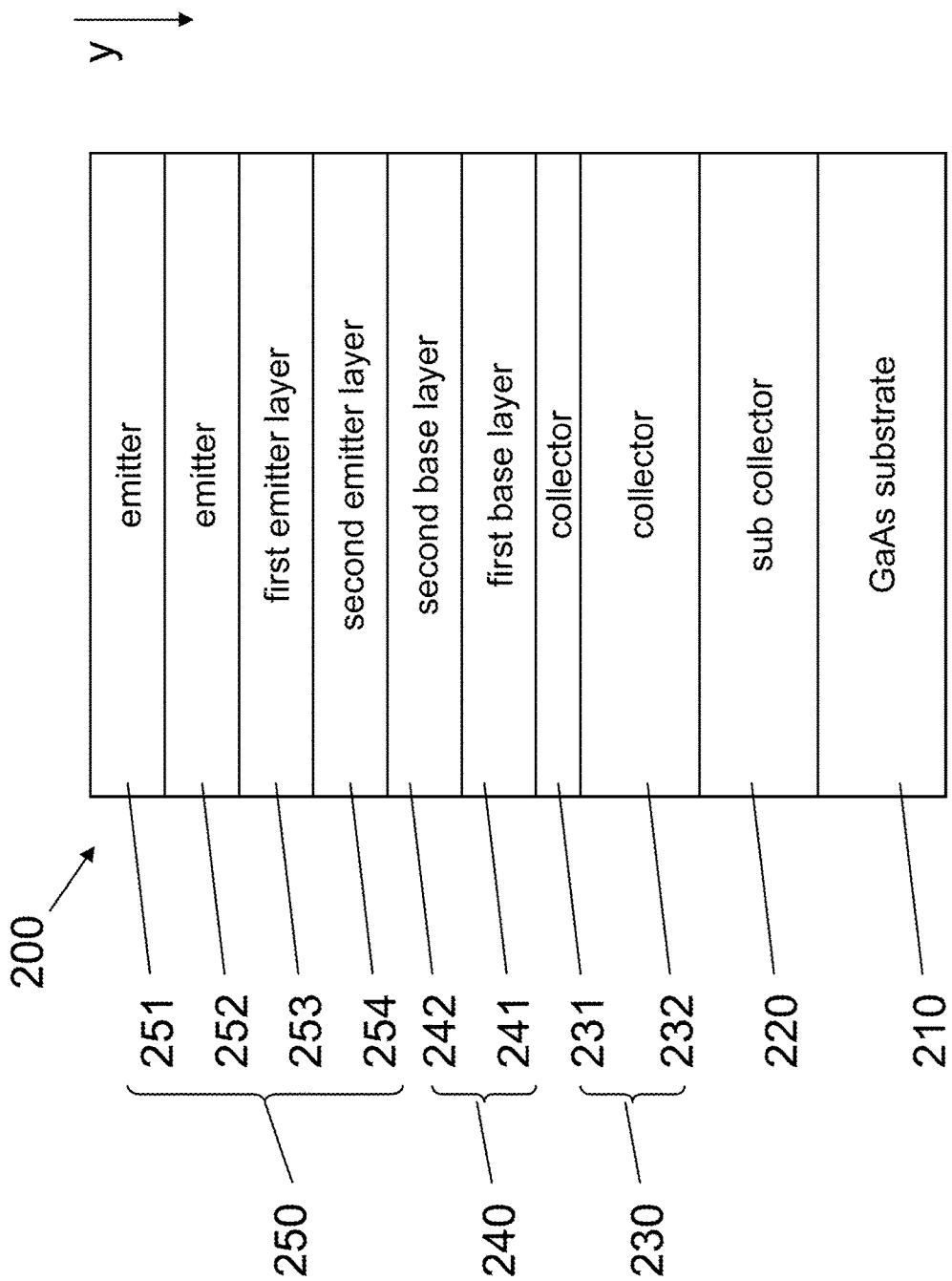
FIG. 6A is a cross-sectional view of a GaAs HBT according to an embodiment of the present invention.
Figure 6C:
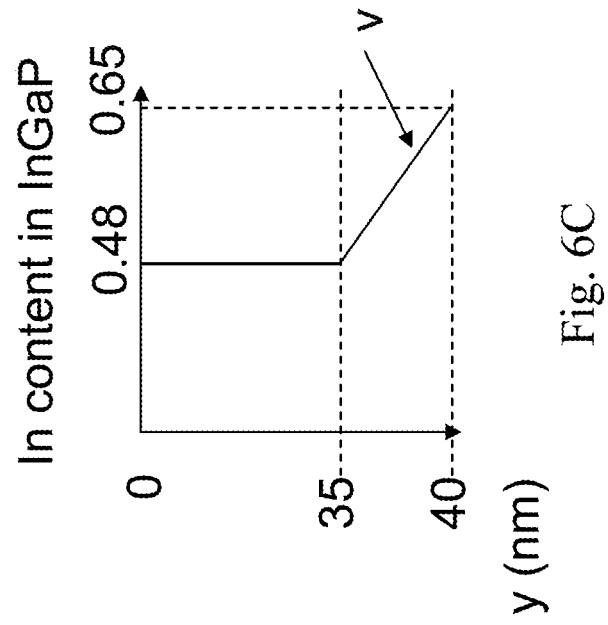
FIG. 6C is a diagram showing the distribution of Indium content inside the first and second emitter layers along the stacking direction of the semiconductor layers in an embodiment of the GaAs HBT shown in FIG. 6A.
Figure 6B:
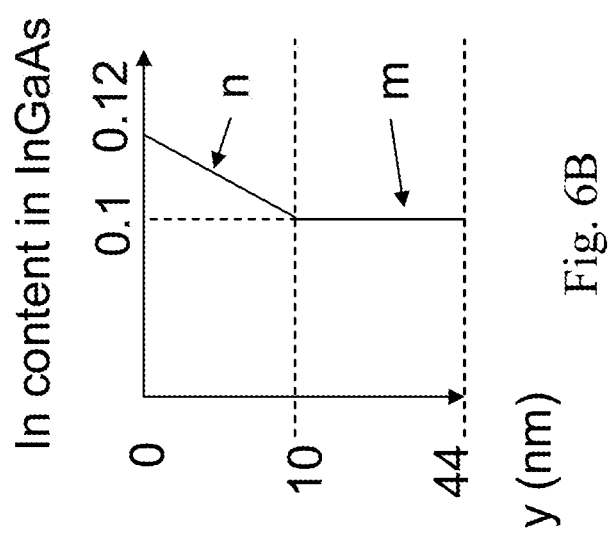
FIG. 6B is a diagram showing the distribution of Indium content of the first and second base layers along the stacking direction of the semiconductor layers in an embodiment of the GaAs HBT shown in FIG. 6A.

FIG. 6A shows another embodiment of the GaAs HBT 200 provided by the present invention, in which the emitter 250 comprises an InGaAs contact layer 251, a GaAs layer 252, and a first emitter layer 253. The first emitter layer 253 is lattice-matched to GaAs with an Indium content of 0.48. The thickness and the doping concentration of the first emitter layer 253 are 40 nm and $2 \times 10^{17}$ cm$^{-3}$, respectively. The profile of the Indium content may be modified to form a second emitter layer 254 composed of Indium-rich $In_vGa_{1-v}P$ with the profile of Indium content v shown in FIG. 6C. On the other hand, as shown in FIG. 6B, the Indium content n in the second base layer 242 comprising $In_nGa_{1-n}As$ is linearly graded from 0.12 at the emitter side to 0.1 at the first base layer side, and the Indium content m is fixed at 0.1 in the first base layer 241 comprising $In_mGa_{1-m}As$. At the base-collector junction, there is a thin InGaAs collector layer 231 with the Indium content graded from 0.10 at the base side to 0 at the collector side. This layer is introduced to smoothly connect the conduction band edge between the base and the collector. The thickness of collector 231 is typically between 5 nm and 30 nm. The collector layer 232 comprises GaAs with the thickness being 1 μm.

FIG. 6D is the two-dimensional device simulation result of Vceoff with different types of devices. The base and emitter layers in FIG. 6D refer to the HBT structure shown in FIG. 6A. T in FIG. 6D is the thickness of each layer. The device in which T of the second base layer is equal to zero corresponds to a conventional HBT. In the conventional GaAs base GaAs HBT where the base consists of 44 nm GaAs and the emitter consists of 40 nm lattice-matched InGaP, the simulated Vceoff is 197 mV. If the base is replaced by InGaAs with the Indium content being 0.1, Vceoff is increased to 223 mV. The Vceoff is even larger (228 mV) with the Indium content being 0.12. On the other hand, in Embodiment 1 shown in FIG. 6D, the second base layer is introduced with the total base thickness being unchanged; the Vceoff is reduced to 214 mV. In Embodiment 2, the Indium-rich InGaP second emitter layer is also introduced; the Vceoff is reduced to 181 mV. It is noted that the introduction of the second emitter layer alone results in Vceoff of 190 mV and 196 mV with the Indium content of the second base layer being 0.1 and 0.12, respectively. The reduction of Vceoff is most pronounced when the device comprises both the second base layer and the second emitter layer.

Figure 7B:
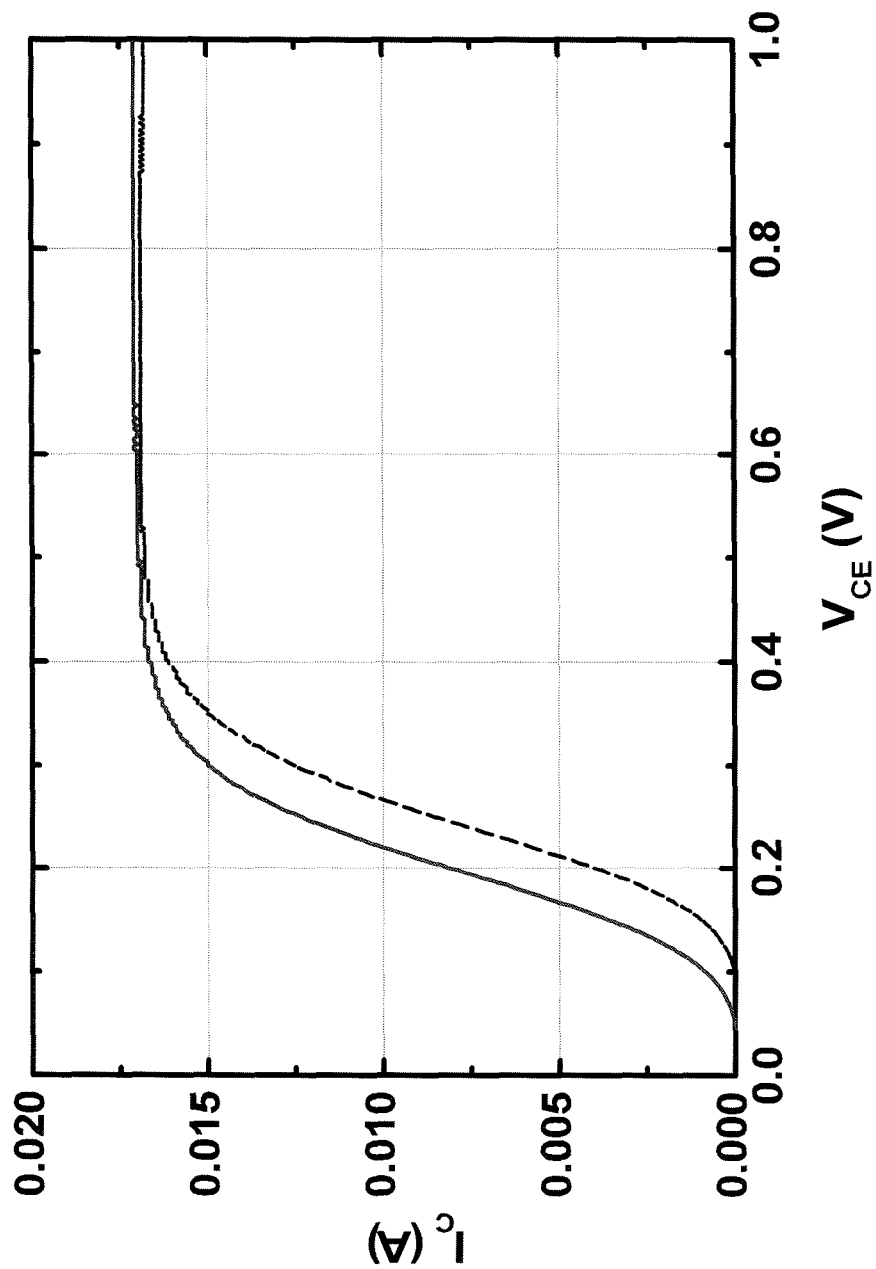
FIG. 7B is a diagram showing measured collector current Ic plotted as a function of collector voltage Vce for the GaAs HBT shown in FIG. 7A (solid line) and a GaAs HBT with a GaAs base (dashed line).
Figure 7C:
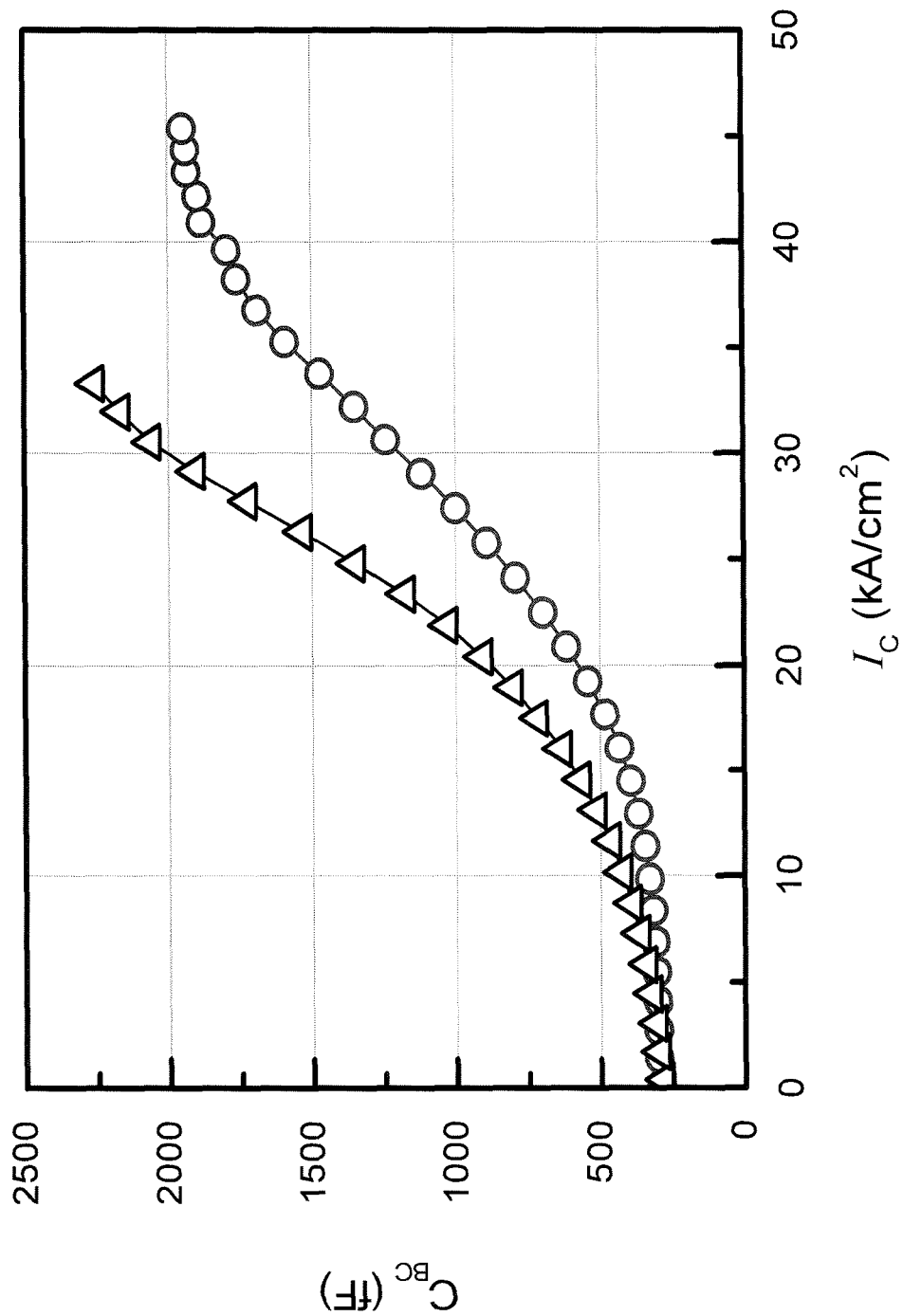
FIG. 7C is a diagram showing measured curves of $C_{bc}$ plotted as a function of $I_c$ for the GaAs HBT shown in FIG. 7A (circle) and the GaAs HBT with a GaAs base (triangle).

FIG. 7A shows an embodiment of the GaAs HBT 200 shown in FIG. 6A, in which the GaAs HBT is fabricated using an epitaxial wafer grown on a GaAs substrate by metal-organic chemical vapor deposition. The Indium content n of second base layer 242 is linearly graded from 0.1 at the first base layer side to 0.12 at the emitter side. The Indium content m of first base layer 241 is fixed at 0.10. FIG. 7B shows measured $I_c$ plotted as a function of $V_{ce}$ of the GaAs HBT in FIG. 7A whose emitter size being 3 μm×40 μm×3 fingers (solid line) and of a conventional GaAs HBT in which GaAs is the base material (dashed line). The Vceoff is lower for the present invention than for the conventional device. FIG. 7C shows a measured $C_{bc}$ plotted as a function of $I_c$ of the GaAs HBT shown in FIG. 7A (circle) and a conventional GaAs HBT in which GaAs is the base material (triangle) for the emitter size of 3 μm×40 μm×3 fingers and Vce=0.5 V. The $C_{bc}$ is smaller for the GaAs HBT of the present invention in which InGaAs is the base material than for the conventional device, particularly at a large $I_c$ corresponding to the knee region.

Figure 7D:
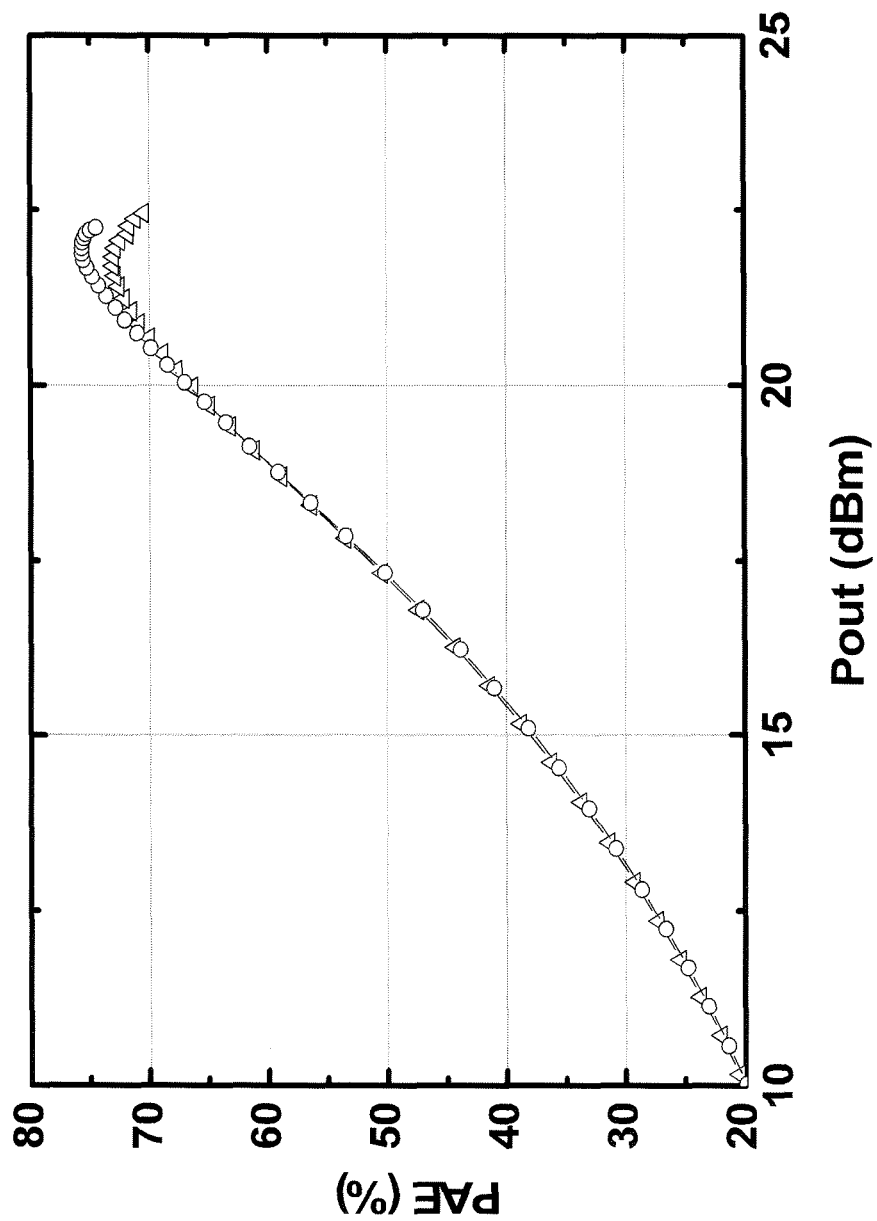
FIG. 7D is a diagram showing measured power-added efficiency (PAE) plotted as a function of output power (Pout) for the GaAs HBT shown in FIG. 7A (circle) and the GaAs HBT with a GaAs base (triangle).

The RF performance of the GaAs HBT shown in FIG. 7A is evaluated. A load-pull measurement is done with the device whose emitter size is 3 μm×40 μm×3 fingers, the frequency being 1.95 GHz, $V_c$ being 3.4V, and $I_c$ being 6.4 mA. FIG. 7D shows the power-added efficiency (PAE) plotted as a function of output power (Pout) of the present invention (circle) and of the GaAs HBT in which GaAs is the base material (triangle). The maximum PAE is increased with the GaAs HBT according to the present invention. This is due to the reduced $C_{bc}$ at the knee region, which reduces the gain suppression at the high power operation.

Figure 8:
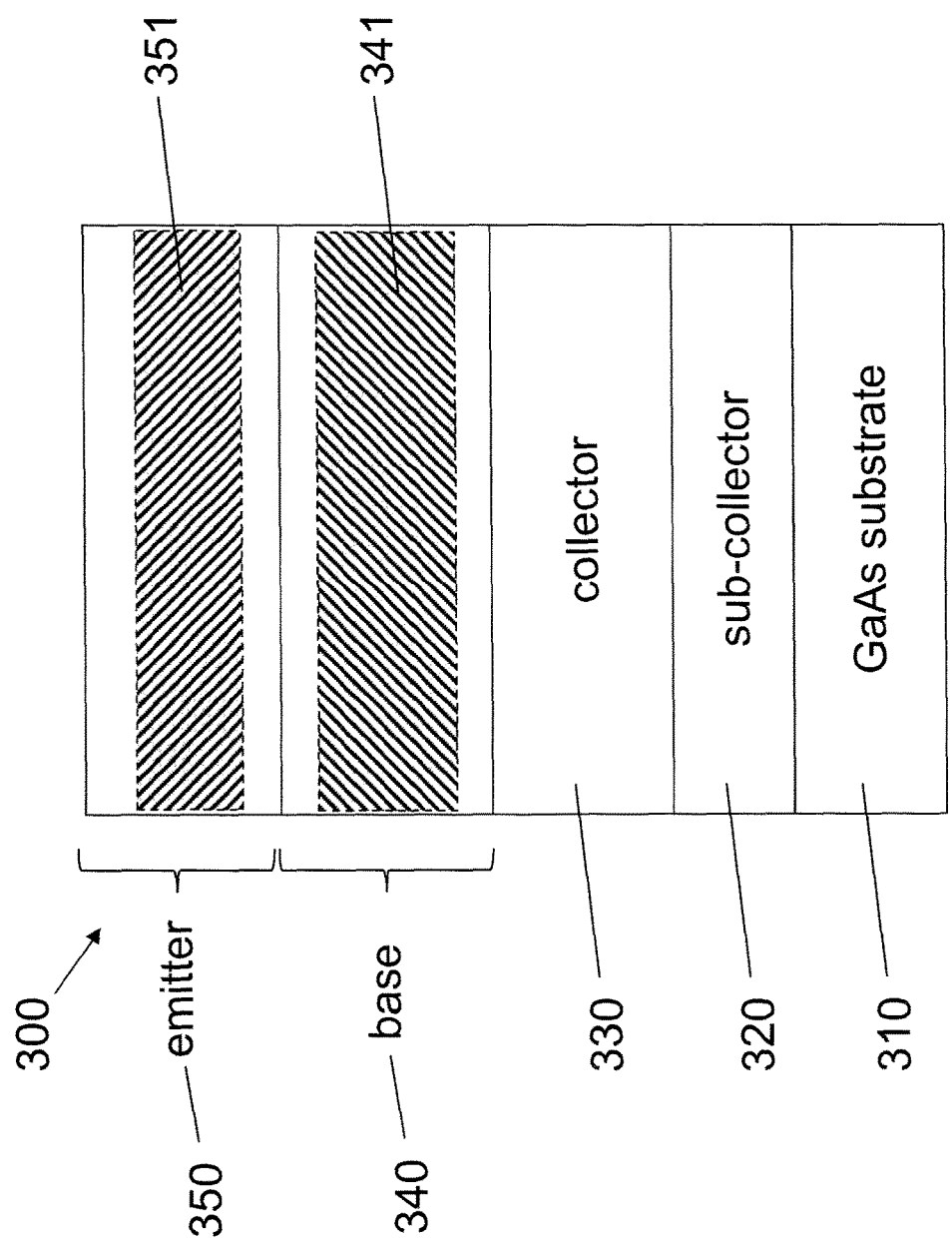
FIG. 8 is a cross-sectional view of a GaAs HBT according to an embodiment of the present invention.

FIG. 8 shows an embodiment of a GaAs HBT 300 provided by the present invention. The GaAs HBT 300 comprises a GaAs substrate 310 and plural semiconductor layers epitaxially grown on the GaAs substrate 310. The plural semiconductor layers sequentially form a sub-collector 320, a collector 330, a base 340, and an emitter 350. The base 340 comprises a first base layer 341, which is pseudomorphic to GaAs with a first bulk lattice constant being at least 0.15% larger than the bulk lattice constant of GaAs. The emitter 350 comprises a first emitter layer 351, which is pseudomorphic to GaAs with a second bulk lattice constant being at least 0.15% smaller than the bulk lattice constant of GaAs. The pseudomorphic emitter layer generates a tensile strain that compensates the compressive strain in the pseudomorphic base layer. The mechanical instability is thus reduced, and the formation and the multiplication of misfit dislocations during the device operation can be avoidable.

In an embodiment, the first emitter layer 351 may consist of $In_xGa_{1-x}As_{1-y}P_y$ with the Indium content x and the Phosphorus content y being between 0 and 1 and satisfying the condition that the bulk lattice constant of the first emitter layer 351 is at least 0.15% smaller than the bulk lattice constant of GaAs.

In an embodiment, the first emitter layer 351 may consist of $In_xGa_{1-x}P$ with the Indium content x being between 0.1 and 0.44. The $In_xGa_{1-x}P$ with the Indium content x being 0.1 and 0.44 has the bulk lattice constant smaller than that of GaAs by 2.8% and 0.3%, respectively.

In an embodiment, the first emitter layer 351 may consist of $GaAs_{1-y}P_y$ with the Phosphorus content y being between 0.03 and 0.5. $GaAs_{1-y}P_y$ has a direct band gap for the Phosphorus content y lower than 0.5. Therefore, the high resistance to the conduction electron passing through the $GaAs_{1-y}P_y$ layer can be avoidable.

In an embodiment, the first base layer 341 may consist of $In_oGa_{1-o}As_{1-p}Sb_p$ with Indium content o and Antimony content p being between 0 and 1 and satisfying the condition that the bulk lattice constant of the first base layer 341 is at least 0.15% larger than the bulk lattice constant of GaAs.

In an embodiment, the first base layer 341 consists of $In_oGa_{1-o}As$ with the Indium content o being between 0.03 and 0.2. $In_oGa_{1-o}As$ with the Indium content being 0.03 and 0.2 has the bulk lattice constant larger than bulk GaAs by 0.2% and 1.4%, respectively.

In an embodiment, first base layer 341 consists of $GaAs_{1-p}Sb_p$ with the Antimony content p being between 0.03 and 0.2.

In any combination of the abovementioned emitter and base materials, the compressive strain in the base layer is compensated by the tensile strain in the emitter layer.

Figure 9B:
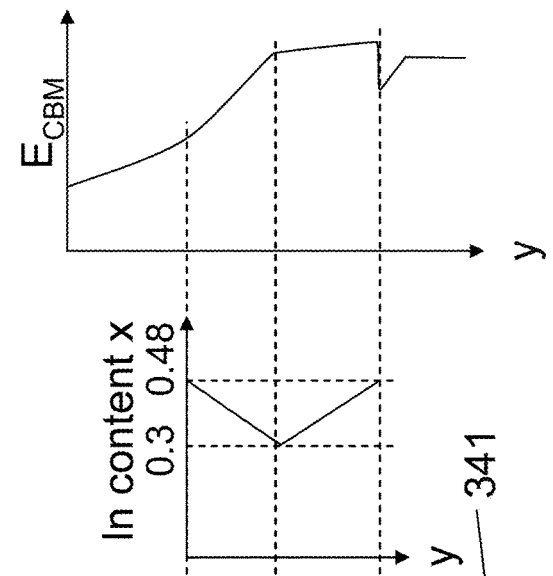
FIG. 9B is a diagram showing the distribution of Indium content inside the first emitter layer along the stacking direction of the semiconductor layers in an embodiment of the GaAs HBT shown in FIG. 9A and the resulting profile of the conduction band edge $E_{CBM}$.
Figure 9A:
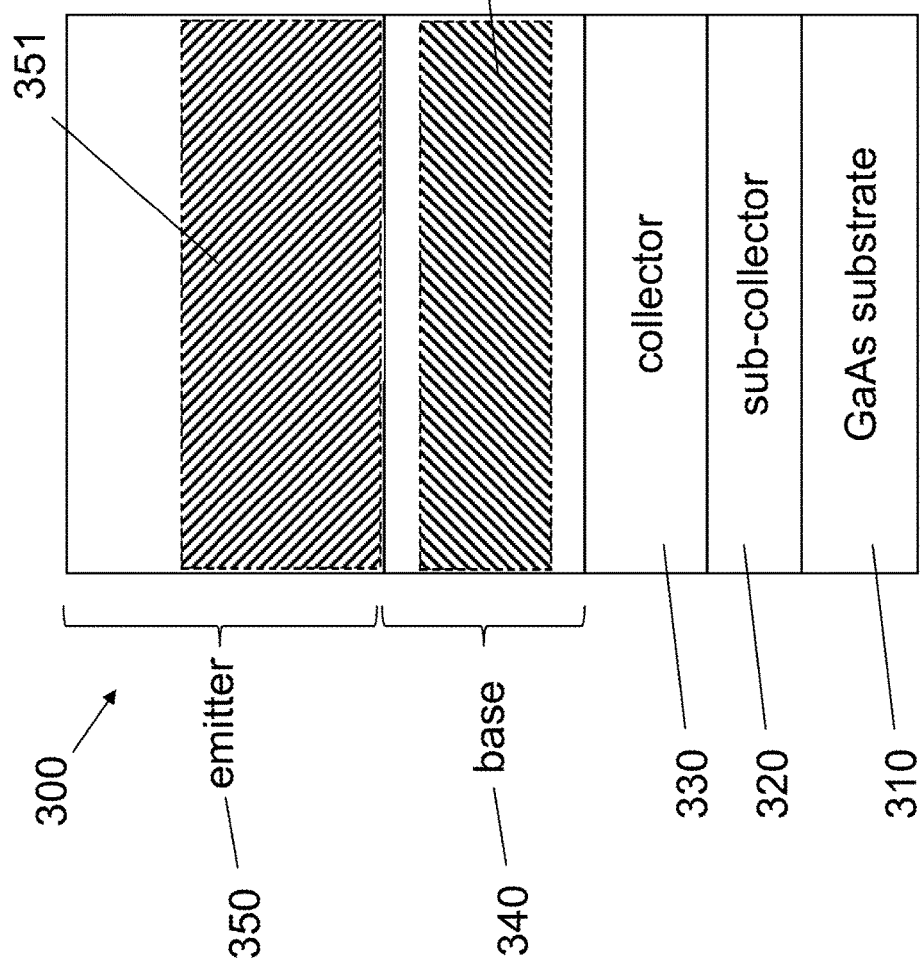
FIG. 9A is a cross-sectional view of a GaAs HBT according to an embodiment of the present invention.

FIG. 9A shows an embodiment of the GaAs HBT shown in FIG. 8. In this embodiment, the first emitter layer 351 comprises Gallium-rich $In_xGa_{1-x}P$. The Gallium-rich $In_xGa_{1-x}P$ has a tensile strain that compensates the compressive strain in first base layer 341. The Indium content x is varied across the first emitter layer 351. For example, the Indium content x may be graded with the minimum in the middle of the $In_xGa_{1-x}P$ layer. Defining the y-axis directed from the emitter side to the collector side along the stacking direction of the plural semiconductor layers, FIG. 9B shows a graded Indium content x along the y-axis with the minimum being near the center of the first emitter layer and the resulting profile of the conduction band edge $E_{CBM}$. In this embodiment, the Indium content x is 0.3 or greater as shown in FIG. 9B. It is because InGaP has an indirect band gap if the Indium content is below 0.3. The high resistance to the conduction electron passing through the InGaP layer can be thus avoidable.

To smoothen the profile of the conduction band edge, a high concentration n-type doping may be introduced in the high Gallium-content region. FIG. 10A is an embodiment of the GaAs HBT 300 shown in FIG. 8, in which a high concentration n-type doping 360 is further introduced at the minimum of the Indium content profile, i.e. the maximum of the Gallium content profile. FIG. 10B shows the resulting profile of the conduction band edge $E_{CBM}$ with the Indium content distribution being same as that shown in FIG. 9B and a planar n-type doping 360 being located at the minimum of the Indium content profile. Comparing with the result shown in FIG. 9B, the conduction electrons can flow more smoothly from the emitter to the base, and therefore a better high-frequency operation can be obtained.

Figures 11A, 11B:
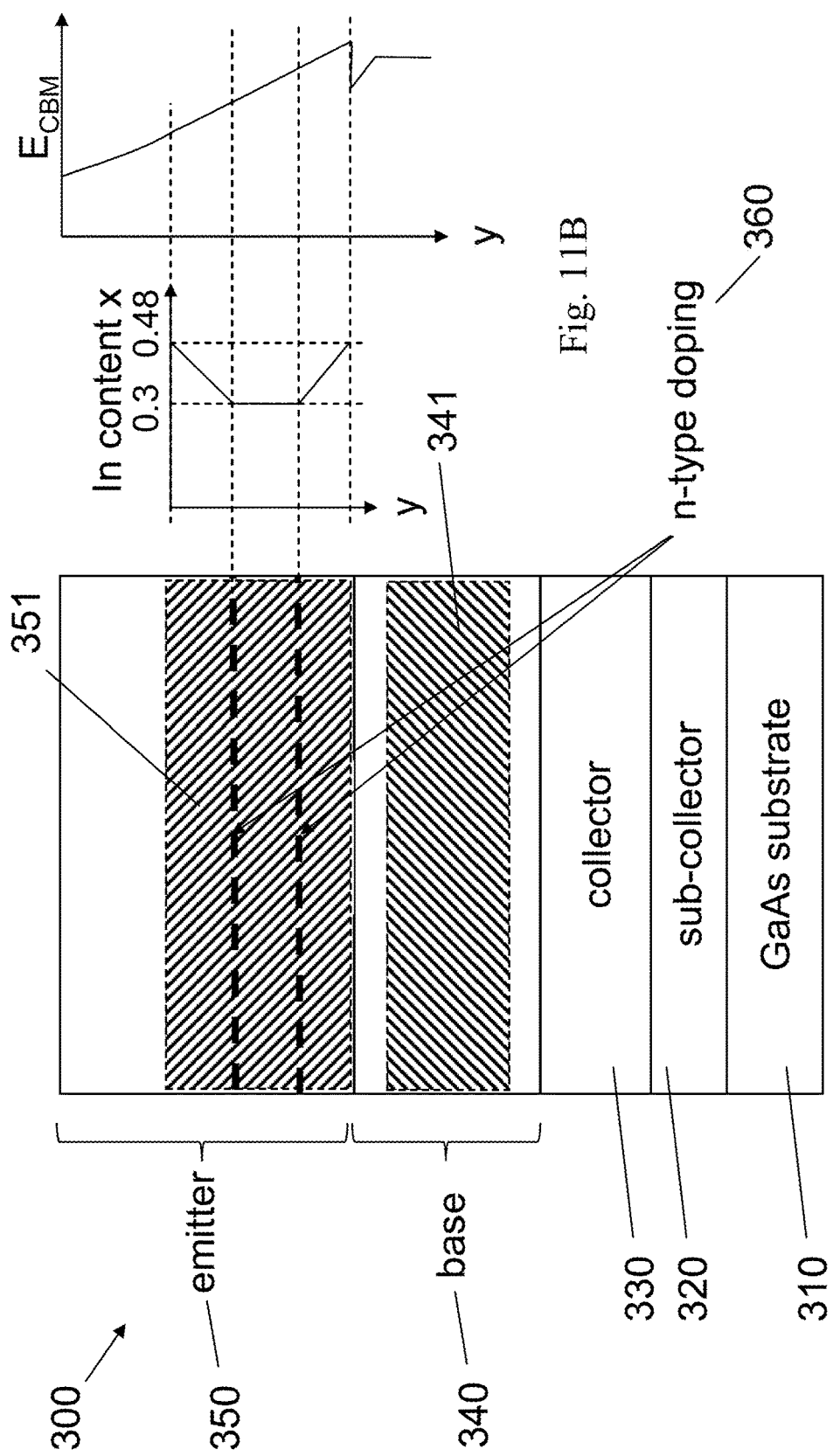
FIG. 11A is a cross-sectional view of a GaAs HBT according to an embodiment of the present invention.
FIG. 11B is a diagram showing the distribution of Indium content inside the first emitter layer along the stacking direction of the semiconductor layers in an embodiment of the GaAs HBT shown in FIG. 11A and the resulting profile of the conduction band edge $E_{CBM}$.

FIG. 11A is another embodiment of the GaAs HBT 300 shown in FIG. 8, in which the first emitter layer 351 comprises a thick Gallium-rich $In_xGa_{1-x}P$ layer with the Indium content x being 0.3. The first emitter layer 351 further comprises two planar n-type doping 360 at both sides of the layer with the Indium content x being 0.3, in order to smoothen the conduction band edge profile, as shown in FIG. 11B. The thick Gallium-rich InGaP layer strongly compensates the compressive strain generated in the pseudomorphic base layer. The formation and the multiplication of misfit dislocations during the device operation are more effectively prevented.

FIG. 12A shows another embodiment of the GaAs HBT 300 shown in FIG. 8. In FIG. 12A, a second emitter layer 352 comprising $In_zGa_{1-z}P$ is introduced between the first emitter layer 351 and the base 340. In the second emitter layer 352, the Indium content z at the base side is made larger than that of the layers with lattice being matched to GaAs, as shown in FIG. 12B, in order to reduce Vceoff. In this case, the second emitter layer 352 introduces additional compressive strain. However, the mechanical instability can be reduced by the tensile strain in the Gallium-rich region in the first emitter 351. The strong tensile strain generated by thick Gallium-rich InGaP compensates the compressive strain in both first base 341 and second emitter 352, and thus ensures the mechanical stability. Two planar n-type doping region 360 are introduced to smoothen the conduction band edge profile from the emitter to the base.

FIGS. 13A, 13B, and 13C show the semiconductor layer structures of GaAs HBTs fabricated to test the effect of strain compensation by the tensile-strained emitter layer of the present invention. FIGS. 13B and 13C show GaAs HBTs according to embodiments of the present invention. The semiconductor layers are fabricated using an epitaxial layers growth by metal-organic chemical vapor deposition. In the GaAs HBT shown FIG. 13A, the emitter comprises a lattice-matched InGaP layer with the Indium content being 0.48 and an additional Indium-rich $In_zGa_{1-z}P$ layer between the lattice-matched InGaP emitter and the base. The Indium content z of the Indium-rich emitter layer is graded from 0.65 at the base side to 0.48 at the emitter side. In the GaAs HBT shown in FIG. 13B, the Gallium-rich $In_xGa_{1-x}P$ emitter layers, whose Indium content profile is similar to that shown in FIG. 9B, is introduced to compensate the compressive strain generated in the base and the Indium-rich $In_zGa_{1-z}P$ emitter. These two layers of the Gallium-rich $In_xGa_{1-x}P$ correspond to the first emitter layer 351 in FIG. 9A, and the Indium-rich $In_zGa_{1-z}P$ layer corresponds to the second emitter 352 in FIG. 12A. The base of this embodiment comprising $In_oGa_{1-o}As$ corresponds to the first base layer. In the GaAs HBT shown in FIG. 13C, the first emitter layer comprises a thick Gallium-rich $In_xGa_{1-x}P$ layer to compensate the strain more strongly. The high-temperature operation lifetime (HTOL) test at an operation condition which is typical to handset power amplifiers is made. The bias condition in the HTOL test is $V_{ce}$=3 V and Ic=20 mA. The emitter size of the test device is 2 μm×20 μm×2 fingers. The junction temperature during test is approximately 210 degree Centigrade. At each type of devices, 45 samples are tested. FIGS. 13D, 13E, and 13F are diagrams showing the result of the HTOL test for the GaAs HBTs shown in FIGS. 13A, 13B, and 13C, respectively. The DC current gain normalized to the initial value is plotted as a function of stress time. Without the strain compensation, a large number of samples show failure after 160 hours test, as shown in FIG. 13D. However, with the strain compensation, the number of failure is reduced in the order of the strength of compensation, as shown in FIGS. 13E and 13F.

Figure 14D:
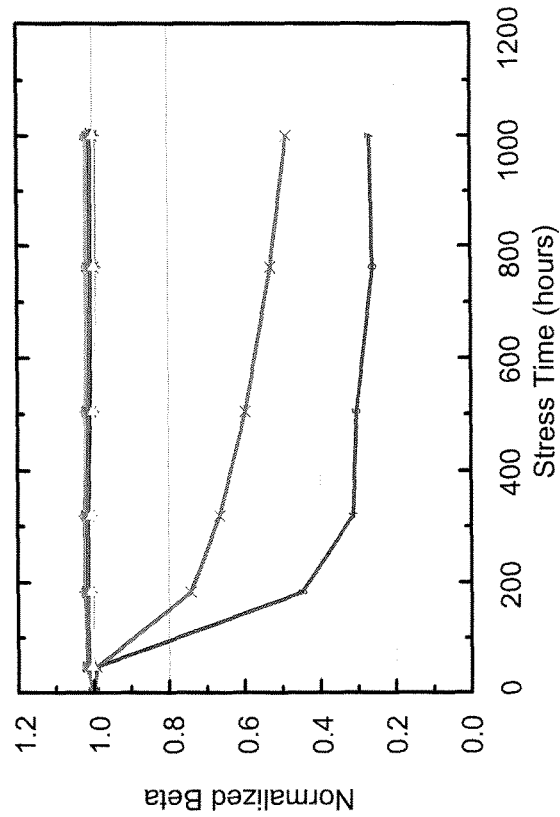
FIG. 14D is a diagram showing the results of the HTOL test with the conventional InGaAs base GaAs HBT shown in FIG. 14B.
Figure 14C:
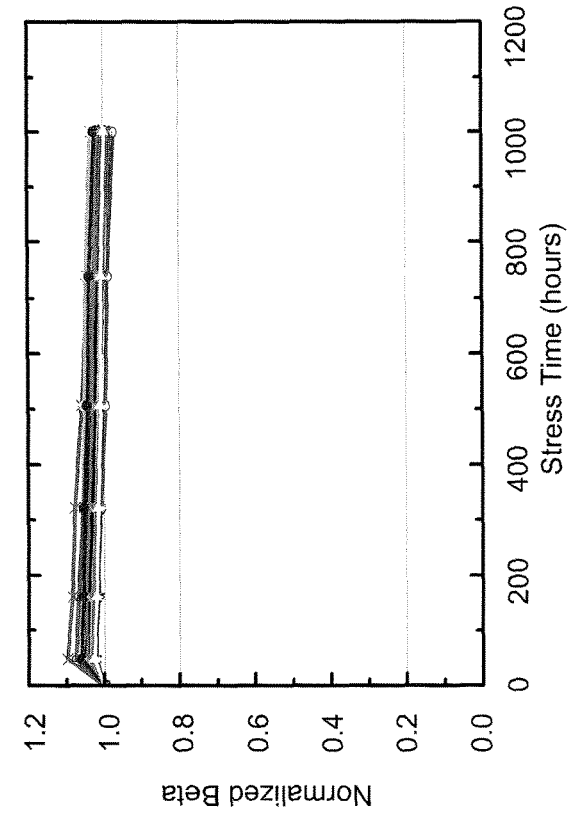
FIG. 14C is a diagram showing the results of the HTOL test for the GaAs HBT according to an embodiment of the present invention shown in FIG. 14A.

FIG. 14A shows an embodiment of the GaAs HBT 300 shown in FIG. 12A, in which the semiconductor layers are fabricated using an epitaxial growth by metal-organic chemical vapor deposition. The first emitter layer comprises a thick Gallium-rich $In_xGa_{1-x}P$ layer with the Indium content x being 0.3 and two planar n-type doping regions. The GaAs HBT further comprises the second emitter layer comprising $In_zGa_{1-z}P$ whose Indium content z is graded from 0.65 to 0.48. The base comprises an $In_oGa_{1-o}As$ layer with uniform Indium content being 0.1 (first base layer) and an $In_qGa_{1-q}As$ layer with Indium content q graded from 0.1 to 0.12 (second base layer) which is similar to the second base layer shown in FIG. 7A. The purpose of inserting the second base layer is to reduce Vceoff. The use of the first base layer composed of InGaAs is to reduce the $C_{bc}$, which is similar to the InGaAs base layers of GaAs HBT 100 and GaAs HBT 200. In this embodiment, the large compressive strain generated by the first and second base layers and the second emitter layer is effectively compensated by the first emitter layer comprising a thick Gallium-rich $In_xGa_{1-x}P$ layer. The HTOL test at an operation condition typical to handset power amplifiers is made with the GaAs HBT shown in FIG. 14A. The HTOL test is also made with the GaAs HBT shown in FIG. 14B, which is a pseudomorphic InGaAs base GaAs HBT based on the prior art. In FIG. 14B, the base layer is composed of InGaAs with the Indium content being fixed at 0.10, and the emitter comprises a lattice-matched InGaP. The result of HTOL test of the present invention is shown in FIG. 14C and that of the prior art is shown FIG. 14D. Several samples of the prior art fail after 200 hours, while the GaAs HBT according to an embodiment of the present invention does not show any failure even after 1000 hours. It should be noted that the total amount of Indium in the base layer of the GaAs HBT shown in FIG. 14A is larger than that of the GaAs HBT shown in FIG. 14B, even while the total base thicknesses is the same. Furthermore, the Indium content in the InGaP emitter near the emitter-base junction is larger with the GaAs HBT shown in FIG. 14A. Therefore, the total compressive strain is much larger with the GaAs HBT shown in FIG. 14A than with the GaAs HBT shown in FIG. 14B. Nevertheless, the GaAs HBT shown in FIG. 14A passes the test.

Figure 14E:
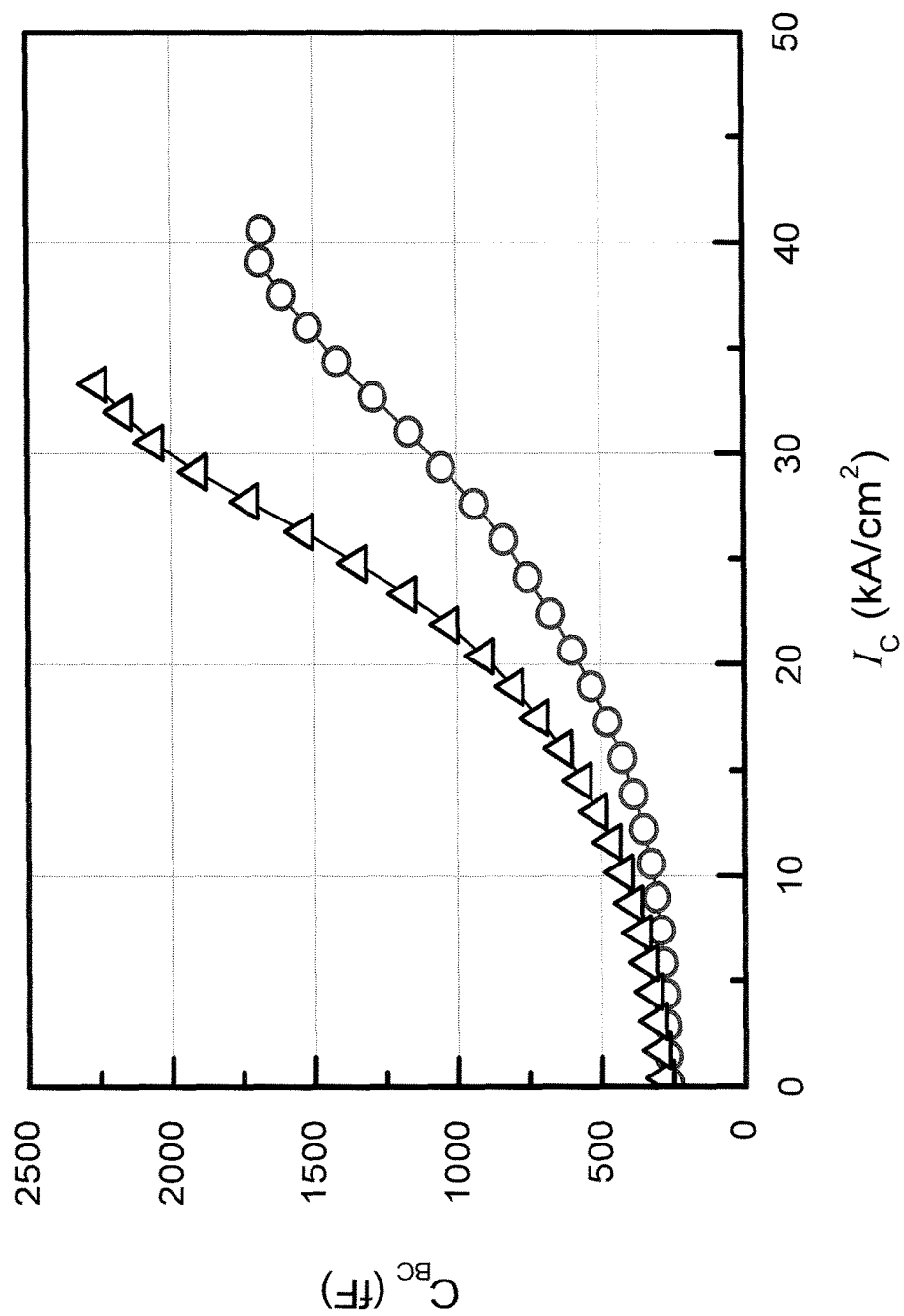
FIG. 14E is a diagram showing measured $C_{bc}$ plotted as a function of $I_c$ for the GaAs HBT shown in FIG. 14A (circle) and a GaAs HBT with a GaAs base (triangle).
Figure 15:
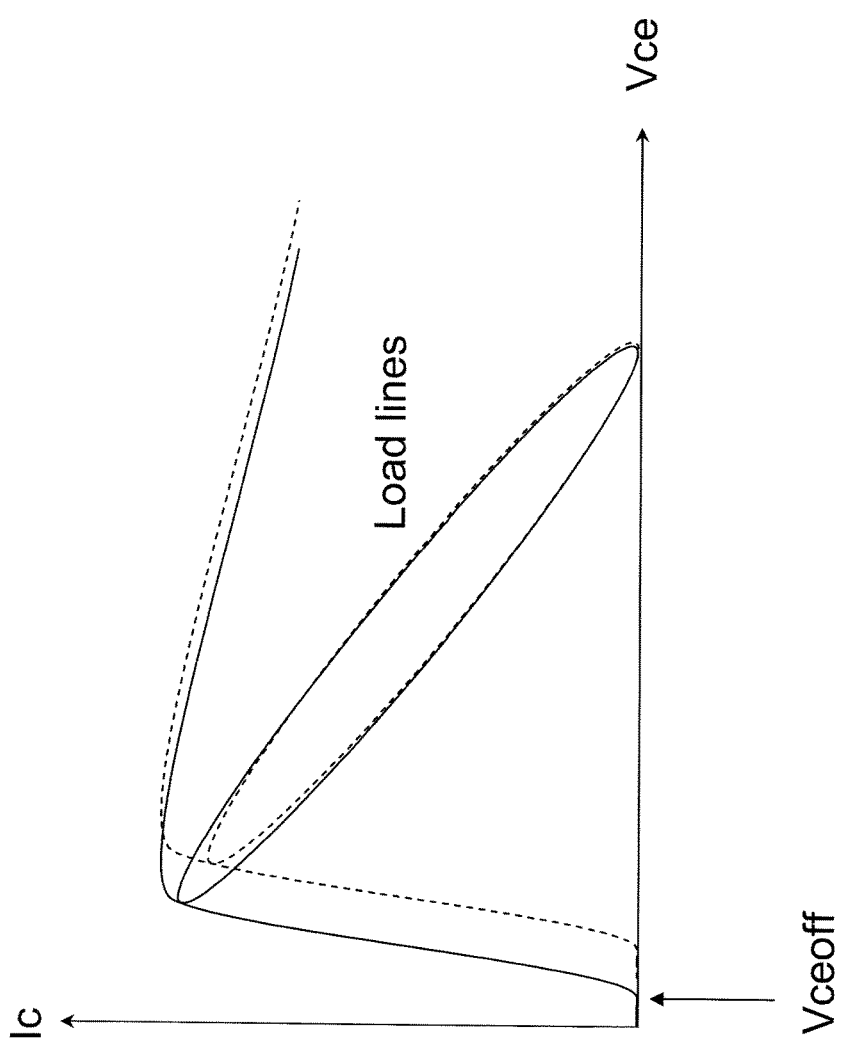
FIG. 15 illustrates the collector current (Ic) and collector voltage (Vce) characteristics showing the Vce offset, Vceoff. Load lines for the device operating as a RF power amplifier are also illustrated.
Figure 16:
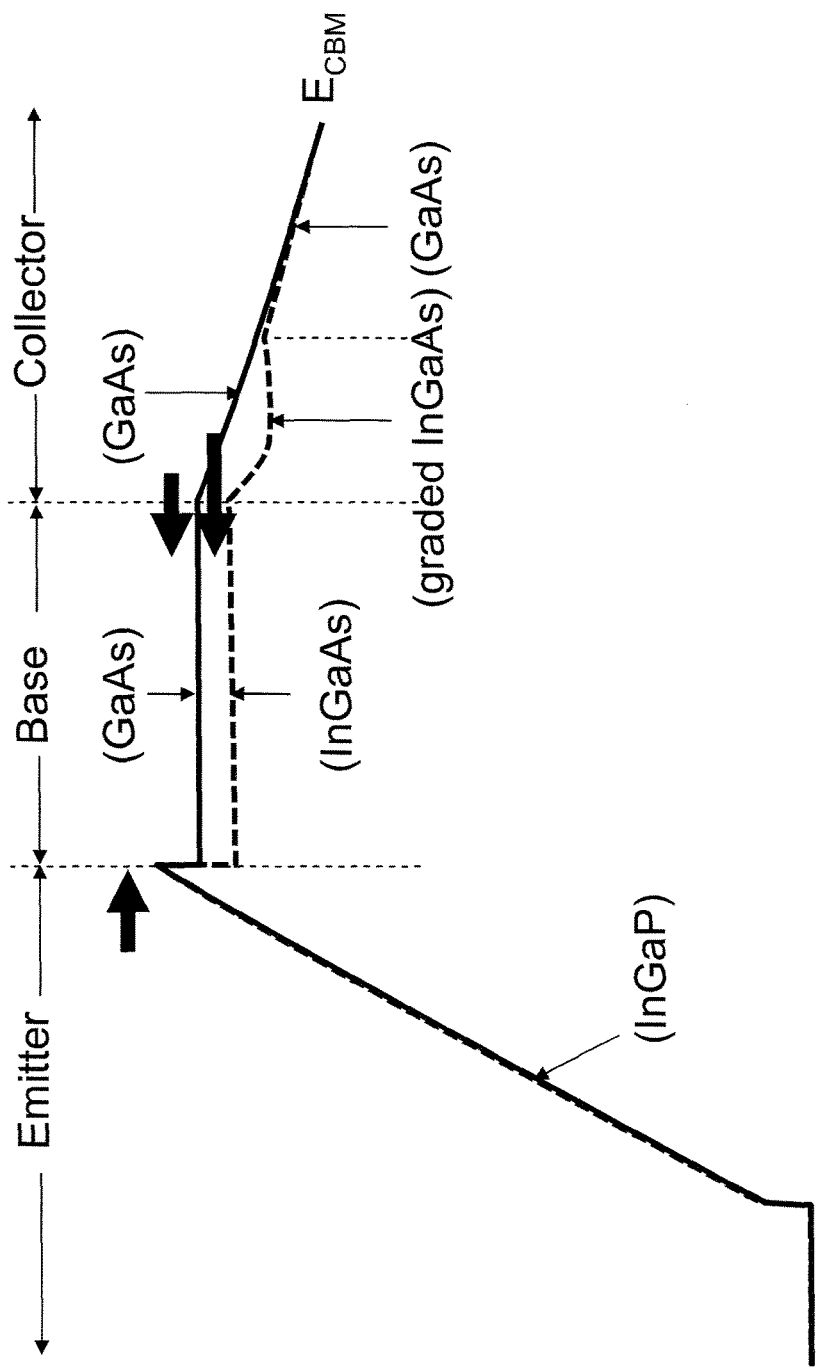
FIG. 16 illustrates the conduction band edge (ECBM) profile for the conventional GaAs HBT with a GaAs base and the conventional pseudomorphic GaAs HBT with an InGaAs base. Arrows illustrate the flow of forward junction electron current.

FIG. 14E shows the measured $C_{bc}$ plotted as a function of $I_c$ with the GaAs HBT shown in FIG. 14A (circle) and a conventional HBT in which GaAs is the base material (triangle). The emitter size is 3 μm×40 μm×3 fingers and Vce is 0.5V. As shown in FIG. 14E, the $C_{bc}$ of the GaAs HBT shown in FIG. 14A, whose base is composed of InGaAs, is much lower than that of the conventional HBT whose base is composed of GaAs, particularly at a large $I_c$ corresponding to the knee region.

In summary, the present invention has the following advantages:
1. In the GaAs HBT comprising pseudomorphic InGaAs base layers with Indium content being increased from the emitter side to the collector side with varied slope, the total amount of Indium is lowered compared with the single base layer with an uniform or linearly graded Indium content. As a result, the misfit dislocations due to the lattice mismatch are reduced or eliminated. The first base layer on the collector side with a large Indium content reduces $C_{bc}$. Thus, the RF performance is improved. On the other hand, the drift electric field across the second base layer on the emitter side with a larger slope of Indium content contributes to the increase of the DC current gain.
2. In the GaAs HBT comprising pseudomorphic InGaAs base layers having a region rich in Indium near the emitter-base junction, the turn-on voltage offset Vceoff in the Ic-Vce characteristics is reduced while not in the conventional GaAs HBT with a pseudomorphic InGaAs base. Thus, the RF performance of power amplifier is improved. The InGaAs base also reduces $C_{bc}$ and improves the RF performance.
3. In the HBT comprising a base layer which is pseudomorphic to GaAs with a bulk lattice constant larger than the bulk lattice constant of GaAs and an emitter layer pseudomorphic to GaAs with a bulk lattice constant smaller than the bulk lattice constant of GaAs, the pseudomorphic emitter layer generates a tensile strain that compensates the compressive strain in the pseudomorphic base layer. The mechanical instability is thus reduced, and the formation and the multiplication of misfit dislocations during the long-term device operation are prevented.

To sum up, the HBT provided by the present invention can indeed get its anticipated objects with a GaAs HBT which has an improved DC and RF performance, an enhanced mechanical stability during a long-term operation, and a better high-frequency operation.

The description referred to the drawings stated above is only for the preferred embodiments of the present invention. Many equivalent local variations and modifications can still be made by those skilled in the art and do not depart from the spirit of the present invention, so they should be regarded to fall into the scope defined by the appended claims.

What is claimed is:

1. A heterojunction bipolar transistor, comprising a plurality of semiconductor layers epitaxially grown on a GaAs substrate and forming a collector above the GaAs substrate, a base on the collector, and an emitter on the base, wherein the base comprises:
   a first base layer comprising $In_iGa_{1-i}As$ with an Indium content i being in the range 0<i<1, the Indium content i varies from an emitter side to a collector side with a first slope s1 being defined as positive when the Indium content i increases from the emitter side to the collector side, and
   a second base layer inserted between the first base layer and the emitter and comprising $In_jGa_{1-j}As$ with an Indium content j being in the range 0<j<1, the Indium content j varies from the emitter side to the collector side with a second slope s2 being defined as positive when the Indium content j increases from the emitter side to the collector side,
   wherein an average of the Indium content i is larger than an average of the Indium content j,
   wherein an average of the slope s2 is positive,
   wherein the average of the first slope s1 is half of the average of the second slope s2 or smaller,
   wherein the first base layer and the second base layer are pseudomorphic epitaxial layers with compressive strains due to the lattice mismatch to the GaAs substrate, and
   wherein the heterojunction bipolar transistor is an npn-type bipolar transistor, and wherein the first base layer and the second base layer have p-type conductivity.

2. The heterojunction bipolar transistor according to claim 1, wherein the Indium content i in the first base layer is between 0.03 and 0.2.

3. A heterojunction bipolar transistor, comprising a plurality of semiconductor layers epitaxially grown on a GaAs substrate and forming a collector over the GaAs substrate, a base on the collector, and an emitter on the base, wherein the base comprises:
   a first base layer comprising $In_mGa_{1-m}As$ with an Indium content m being in the range 0<m<1, and
   a second base layer inserted between the second base layer and the emitter and comprising $In_nGa_{1-n}As$ with an Indium content n being in the range 0<n<1, wherein an average Indium content n of the second base layer is larger than the Indium content m of the first base layer at a second base layer side inside the first base layer, wherein the first base layer and the second base layer are pseudomorphic epitaxial layers with compressive strains due to the lattice mismatch to the GaAs substrate, wherein the heterojunction bipolar transistor is an npn-type bipolar transistor, and wherein the first base layer and the second base layer have p-type conductivity.

4. The heterojunction bipolar transistor according to claim 3, wherein the Indium content n of the second base layer increases from a first base layer side to an emitter side.

5. The heterojunction bipolar transistor according to claim 3, wherein the Indium content m in the first base layer is between 0.03 and 0.2.

6. The heterojunction bipolar transistor according to claim 3, wherein the emitter comprises a first emitter layer lattice-matched to GaAs, and the emitter further comprises a second emitter layer inserted between the second base layer and the first emitter layer, wherein the second emitter layer comprises $In_vGa_{1-v}P$ with an Indium content v being between 0.53 and 0.8, wherein the second emitter layer is a pseudomorphic epitaxial layer with a compressive strain due to the lattice mismatch to the GaAs substrate, and wherein the first emitter layer the second emitter layer have n-type conductivity.

7. A heterojunction bipolar transistor, comprising a plurality of semiconductor layers epitaxially grown on a GaAs substrate and forming a collector over the GaAs substrate, a base on the collector, and an emitter on the base, wherein the base comprises a first base layer which is pseudomorphic to GaAs with a first bulk lattice constant being at least 0.15% larger than the bulk lattice constant of GaAs, wherein the emitter comprises a first emitter layer which is pseudomorphic to GaAs with a second bulk lattice constant being at least 0.15% smaller than the bulk lattice constant of GaAs, wherein the first base layer is a pseudomorphic epitaxial layer with a compressive strain due to the lattice mismatch to the GaAs substrate, wherein the first emitter layer is a pseudomorphic epitaxial layer with a tensile strain due to the lattice mismatch to the GaAs substrate, wherein the heterojunction bipolar transistor is an npn-type bipolar transistor, wherein the first base layer has p-type conductivity, and wherein the first emitter layer has n-type conductivity.

8. The heterojunction bipolar transistor according to claim 7, wherein the first emitter layer consists of $In_xGa_{1-x}As_{1-y}P_y$ with an Indium content x and a Phosphorus content y being between 0 and 1 and satisfying the condition that the bulk lattice constant of the first emitter layer is at least 0.15% smaller than the bulk lattice constant of GaAs.

9. The heterojunction bipolar transistor according to claim 7, wherein the first emitter layer consists of $In_xGa_{1-x}P$ with an Indium content x being between 0.1 and 0.44.

10. The heterojunction bipolar transistor according to claim 9, wherein the emitter further comprises a second emitter layer inserted between the first base layer and the first emitter layer, wherein the second emitter layer consists of $In_zGa_{1-z}P$ with an Indium content z being between 0.53 and 0.8, wherein the second emitter layer is a pseudomorphic epitaxial layer with a compressive strain associated with the lattice mismatch with respect to the GaAs substrate, and wherein the second emitter layer has n-type conductivity.

11. The heterojunction bipolar transistor according to claim 7, wherein the first emitter layer consists of $GaAs_{1-y}P_y$ with a Phosphorus content y being between 0.03 and 0.5.

12. The heterojunction bipolar transistor according to claim 7, wherein the first base layer consists of $In_oGa_{1-o}As_{1-p}Sb_p$ with an Indium content o and an Antimony content p being between 0 and 1 with the combination of o and p satisfying that the bulk lattice constant of the first base layer is at least 0.15% larger than the bulk lattice constant of GaAs.

13. The heterojunction bipolar transistor according to claim 7, wherein the first base layer consists of $In_oGa_{1-o}As$ with an Indium content o being between 0.03 and 0.2.

14. The heterojunction bipolar transistor according to claim 13, wherein the base further comprises a second base layer inserted between the first base layer and the first emitter layer, and the second base layer consists of $In_qGa_{1-q}As$ with an average Indium content q being larger than Indium content o of the first base layer at a second base layer side inside first base layer, wherein the second base layer is a pseudomorphic epitaxial layer with a compressive strain due to the lattice mismatch to the GaAs substrate, and wherein the second base layer has p-type conductivity.

15. The heterojunction bipolar transistor according to claim 14, wherein the Indium content q increases from a first base layer side to an emitter side.

16. The heterojunction bipolar transistor according to claim 7, wherein first base layer consists of $GaAs_{1-p}Sb_p$ with an Antimony content p being between 0.03 and 0.2.

* * * * *

UNITED STATES PATENT AND TRADEMARK OFFICE
CERTIFICATE OF CORRECTION

PATENT NO.         : 10,256,329 B2
APPLICATION NO.    : 14/846110
DATED              : April 9, 2019
INVENTOR(S)        : Takatani et al.

It is certified that error appears in the above-identified patent and that said Letters Patent is hereby corrected as shown below:

In the Claims

In Column 14, Line 65, in Claim 3 change "a second base layer inserted between the second base" to --a second base layer inserted between the first base--.

Signed and Sealed this
Fourteenth Day of April, 2020

Andrei Iancu
*Director of the United States Patent and Trademark Office*